(12) United States Patent
Yoshida

(10) Patent No.: US 11,018,164 B2
(45) Date of Patent: May 25, 2021

(54) THIN-FILM TRANSISTOR SUBSTRATE, DISPLAY PANEL, AND DISPLAY DEVICE

(71) Applicant: SHARP KABUSHIKI KAISHA, Sakai (JP)

(72) Inventor: Masahiro Yoshida, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 139 days.

(21) Appl. No.: 16/472,790

(22) PCT Filed: Jan. 12, 2018

(86) PCT No.: PCT/JP2018/000563
§ 371 (c)(1),
(2) Date: Jun. 21, 2019

(87) PCT Pub. No.: WO2018/135380
PCT Pub. Date: Jul. 26, 2018

(65) Prior Publication Data
US 2020/0335531 A1 Oct. 22, 2020

(30) Foreign Application Priority Data
Jan. 19, 2017 (JP) .............................. JP2017-007141

(51) Int. Cl.
*H01L 29/786* (2006.01)
*H01L 27/12* (2006.01)
(Continued)

(52) U.S. Cl.
CPC ........ *H01L 27/1251* (2013.01); *G02F 1/1368* (2013.01); *G02F 1/136209* (2013.01);
(Continued)

(58) Field of Classification Search
CPC ........... H01L 29/78633; H01L 27/3272; H01L 27/124
See application file for complete search history.

(56) References Cited

U.S. PATENT DOCUMENTS

| 5,835,169 A | 11/1998 | Kwon et al. |
| 6,242,769 B1* | 6/2001 | Chang ............... H01L 27/14678 257/291 |
| 2016/0342048 A1* | 11/2016 | Huang .............. G02F 1/136209 |

FOREIGN PATENT DOCUMENTS

| JP | H11-101992 A | 4/1994 |
| JP | H09-218424 A | 8/1997 |

* cited by examiner

*Primary Examiner* — Cuong Q Nguyen
*Assistant Examiner* — Peter M Albrecht
(74) *Attorney, Agent, or Firm* — ScienBiziP, P.C.

(57) ABSTRACT

A thin-film transistor substrate includes a thin-film transistor and a light-shielding part. The thin-film transistor includes a gate electrode, a semiconductor part made from a semiconductor material and superimposed on a part of the gate electrode via a first insulating film, a source electrode on a part of the semiconductor part and connected to the semiconductor part, and a drain electrode on a part of the semiconductor part and connected to the semiconductor part with spaced apart from the source electrode. The light-shielding part includes a first light-shielding section disposed above the semiconductor part, the source electrode, and the drain electrode via the second insulating film and superimposed on the semiconductor part, and a second light-shielding section not to be superimposed on the gate electrode, the source electrode, and the drain electrode and having an opening adjacent to the thin-film transistor.

13 Claims, 12 Drawing Sheets

(51) Int. Cl.
*G02F 1/1362* (2006.01)
*G02F 1/1368* (2006.01)
(52) U.S. Cl.
CPC .. *G02F 1/136227* (2013.01); *G02F 2201/121* (2013.01); *G02F 2201/123* (2013.01)

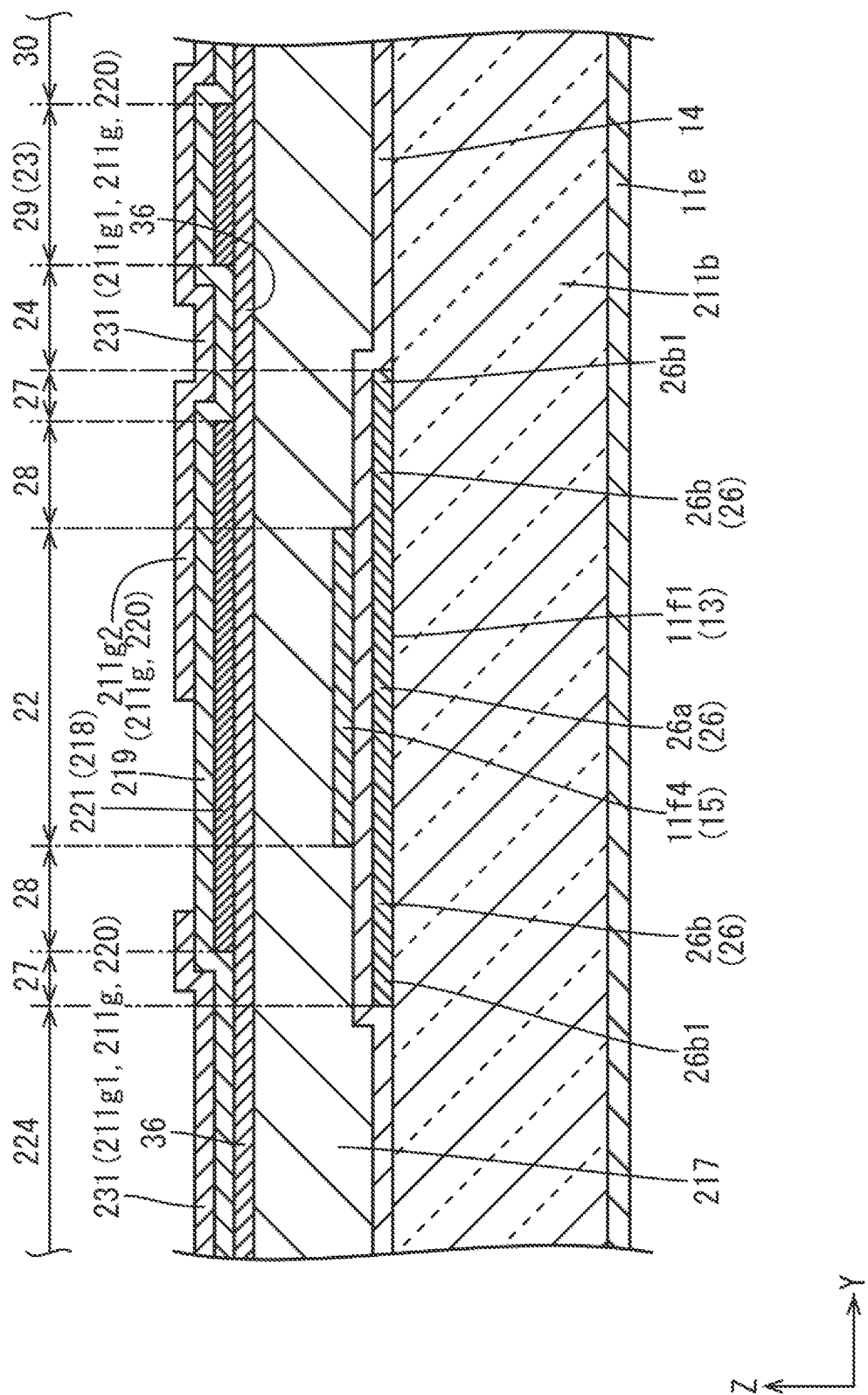

THIN-FILM TRANSISTOR SUBSTRATE, DISPLAY PANEL, AND DISPLAY DEVICE

TECHNICAL FIELD

The present invention relates to a thin film transistor substrate, a display panel, and a display device.

BACKGROUND ART

Examples of currently-known liquid crystal di-play devices include one described in Patent Literature 1 as under. The liquid crystal display device described in Patent Literature 1 is provided with a thin-film transistor substrate. The thin-film transistor substrate has a storage electrode made from a conductive material for shielding light. The storage electrode completely shields a data line from a pixel electrode as well as a gate line from a pixel electrode to increase an aperture ratio and to prevent a cross talk for eliminating declination of a liquid crystal. Accordingly, an improved image quality is obtainable.

RELATED ART DOCUMENT

Patent Document

Patent Literature 1
Japanese Unexamined Patent Application Publication No.

Problem to be Solved by the Invention

The storage electrode of the thin-film transistor substrate described in Patent Literature 1 as above is made from a conductive material that shields light. For instance, the material specifically adopts a metallic material. When the storage electrode is formed with the metallic material, a light shielding effect is obtainable mainly by reflecting light on a surface of the storage electrode. On the other hand, light reflected on the surface of the storage electrode is applied to an active layer composed of a semiconductor material in the thin-film transistor, properties of the thin-film transistor may be affected adversely.

DISCLOSURE OF THE PRESENT INVENTION

The technology described herein was made in view of the above circumstances. An object is to suppress application of light to a semiconductor part.

Means for Solving the Problem

An embodiment of the present invention includes a thin-film transistor and a light-shielding part. The thin-film transistor at least includes a gate electrode, a semiconductor part, a source electrode, and a drain electrode. The semiconductor part is made from a semiconductor material, and is configured to be superimposed on at least a part of the gate electrode via a first insulating film on an upper layer side. The source electrode is disposed on at least a part of the semiconductor part on an upper layer side, and is configured to be connected to the semiconductor part. The drain electrode is disposed on at least a part of the semiconductor part on an upper layer side, and is configured to be connected to the semiconductor part while being spaced apart from the source electrode. The light-shielding part is disposed on an upper layer side with respect to the semiconductor part, the source electrode, and the drain electrode via a second insulating film. The light-shielding part at least includes a first light-shielding section and a second light-shielding section. The first light-shielding section is disposed on an upper layer side with respect to the semiconductor part, the source electrode, and the drain electrode via a second insulating film, and is configured to be superimposed on the semiconductor part. The second light-shielding section is configured not to be superimposed on the gate electrode, the source electrode, and the drain electrode, and has an opening adjacent to the thin-film transistor.

With such a configuration as above, if a signal is applied to the gate electrode and the source electrode individually that form the thin-film transistor, current flows between the source electrode and the drain electrode via the semiconductor part made from the semiconductor material. The light-shielding part includes the first light-shielding section that is disposed on the upper layer side with respect to the semiconductor part via the second insulating film and is configured to be superimposed on the semiconductor part. The first light-shielding section allows shielding of external light applied from the upper layer side to the semiconductor part made from the semiconductor material, leading to suppressed application of light to the semiconductor part. In contrast to this, if external light is applied from a lower layer side with respect to the gate electrode, source electrode, and the drain electrode, it is assumed that external light that is incapable of being shielded by the gate electrode, the source electrode, and the drain electrode is reflected by the first light-shieldng section. Under such an assumption, reflected light may directly applied to the semiconductor part. Alternatively, the reflected light may be multiply reflected between the gate electrode and the light-shielding part, leading to application of the light to the semiconductor part. With regarding to this, the light-shielding part includes the second light-shielding section not superimposed on the gate electrode, the source electrode, and the drain electrode, and the second light-shielding section includes an opening adjacent to the thin-film transistor. Accordingly, the external light applied from the lower layer side with respect to the gate electrode, the source electrode, and the drain electrode and not shielded by the gate electrode, the source electrode, and the drain electrode is likely to pass through the opening of the second light-shielding section easily, and is unlikely to contact the first light-shielding section from the lower layer side. This causes difficulty in generation of the light reflected from the first light-shielding section, leading to suppressed application of the light to the semiconductor part the above, a variation in property of the thin-film transistor in association with the application of the light to the semi-conductor part, especially a leak current that may be generated in the thin-film transistor in an off state can be decreased.

The following configuration is preferred for the embodiment of the present invention.

(1) The gate electrode may include a first gate electrode component where the source electrode and the drain electrode are superimposed, and a second gate electrode component where the source electrode and the drain electrode are not superimposed. The second light-shielding section includes the opening arranged adjacent to the second gate electrode component. With such a configuration, the external light applied from the lower layer side adjacent to the first gate electrode component of the gate electrode is shielded by the source electrode or the drain electrode if the source electrode or the drain electrode is protruded from the gate electrode. If the external light is reflected on the first light-shielding section, light reflected is likely to contact the source electrode or the drain electrode on the upper layer side with respect to the semiconductor part, whereas light reflected is unlikely to contact the semiconductor part. In contrast to this, if external light applied from the lower layer side adjacent to the second gate electrode component of the gate electrode is reflected on the first light shielding section, light reflected may possibly contact a region of the semiconductor part on the upper layer side where neither the source electrode nor the drain electrode is arranged. In contrast to this, since t the second light-shielding section has the openings that are disposed adjacent to the second gate electrode component, external light reflected adjacent to the second gate electrode component from the lower layer side is likely to pass through the opening of the second light-shielding section, and thus is likely to be reflected on the first light-shielding section. This enables suppressed irradiation of light to the semiconductor part.

(2) The light-shielding part may include an extended opening in at least a part of a region superimposed on the second gate electrode component, the extended opening being in communication with the opening. With such a configuration, the external light applied adjacent to the second gate electrode component from the lower layer side, especially oblique external light, passes through the opening of the second light-shielding section and the extended opening in communication therewith. This causes more difficulty in reflection of the external light on the first light-shielding section. This enables more suppressed application of the light to the semiconductor part.

(3) The light-shielding part may include an extended light-shielding part configured not to be superimposed on the semiconductor part but to be superimposed on the gate electrode and to be connected to the first light-shielding section. With such a configuration, the extended light-shielding part connected to the first light-shielding section allows more suitable shielding of the external light applied to the semiconductor part from the upper layer side, leading to more suppressed application of light to the semiconductor part.

(4) The thin-film transistor substrate may further include a pixel electrode disposed on the light-shielding part via a third insulating film on an upper layer side and configured to be connected to the drain electrode. The pixel electrode may at least include a first pixel electrode component that is not superimposed on the thin-film transistor, and a second pixel electrode component that is superimposed on at least a part of the thin-film transistor. The light-shielding part may include a pixel light-shielding portion that is opened such that the second light-shielding section surrounds the first pixel electrode component and is made from a conductive material. The pixel electrode may be arranged such that the second pixel electrode component is partially superimposed on at least apart of the first light-shielding section. With such a configuration as above, the pixel electrode is charged in response to flow of a current between the source electrode and the drain electrode via the semiconductor part. Since the light-shielding part includes the light-shielding part that is opened such that the second light-shielding section surrounds the first pixel electrode component, light passing through the opening is able to be deflected toward the pixel electrode. The light-shielding part disposed on the light-shielding part via the third insulating film on the upper layer side includes the second pixel electrode component a part of which is superimposed on at least a part of the first light-shielding section of the light-shielding part made from a conductive material. This forms electrostatic capacity between the pixel electrode and the first light-shielding section. Accordingly, if the thin-film transistor is in an off state, such a state is suitable for keeping voltage charged in the pixel electrode. This allows prevention of visible defects such as lowered contrast and display unevenness. Moreover, the light-shielding part achieves electric field shielding between lines connected to the gate electrode or the source electrode and the pixel electrode. This leads to difficulty in formation of parasitic capacitance by the pixel electrode. Moreover, if the thin-film transistor substrate controls orientation of liquid crystal molecules, disturbed orientation of the liquid crystal molecules such as reverse tilt is obtainable.

(5) The pixel electrode may include an opening superimposed part disposed such that the second pixel electrode component s superimposed on the opening of the second light-shielding section. With such a configuration, the second pixel electrode component of the pixel electrode includes the opening superimposed part configured to be superimposed on the opening of the second light-shielding section, light passing through the opening of the second light-shielding section is available effectively with an electric field based on the voltage charged in the pixel electrode containing the opening superimposed part. Moreover, the pixel electrode is capable of shielding the electric field at the opening of the second light-shielding section entirely that is generated from the lines connected to the gate electrode or the source electrode to the pixel electrode. Accordingly, if the thin-film transistor substrate controls orientation of the liquid crystal molecules, disturbed orientation of the liquid crystal molecules such as reverse tilt is avoidable.

(6) The gate electrode may include paired ends that form opposite sides. The paired ends may not be superimposed on the source electrode and the drain electrode, whereas the light-shielding part may include paired openings in such a manner that the second light-shielding section is arranged adjacent to the paired ends. The pixel electrodes may be disposed at least in pair so as to be arranged opposite to the semiconductor part with respect to the paired openings in the second light-shielding section. The pixel electrodes in the pair may be arranged such that the opening superimposed part of the second pixel electrode components is superimposed on the paired openings of the second light-shielding section. With such a configuration, a part of the gate electrode adjacent to the paired ends is opened. Accordingly, the external light applied to the gate electrode from the lower layer side and is not shielded with the gate electrode is unlikely to pass through the paired openings of the second light-shielding section, leading to more difficulty in contact to the first light-shielding section from the lower layer side. In addition, the opening superimposed parts of the second pixel electrode component that forms the paired pixel electrodes are superimposed on the paired openings in the second light-shielding section. Accordingly, the light passing through the paired openings of the second light-shielding section is available effectively with an electric field based on the voltage charged in the paired pixel electrodes. Moreover, the pixel electrode is capable of shielding the electric field at the opening of the second light-shielding section entirely that is generated from the lines connected to the gate electrode or the source electrode to the pixel electrode. Accordingly, if the thin-film transistor substrate controls orientation of the liquid crystal molecules, disturbed orientation of the liquid crystal molecules such as reverse tilt is avoidable.

(7) The light-shielding part may include the second light-shielding section having at least the pixel light-shielding portions in pair, and at least one of the paired openings in the second light-shielding section is in communication with one of the paired openings of the pixel light-shielding portions adjacent thereto. Such a configuration obtains an enlarged open range of the light-shielding part, leading to easy patterning of the light-shielding part.

(8) The thin-film transistor substrate may further include a common electrode disposed between the light-shielding part and the third insulating film or between the light-shielding part and the second insulating film, and configured to be superimposed on at least the first pixel electrode component of the pixel electrode. The common electrode may include a common electrode-side opened superimposed part configured to be superimposed on the opening superimposed part. With such a configuration, an electrostatic capacity is generated between the first pixel electrode component of the pixel electrode and the common electrode adjacent to each other via the second insulating film or the third insulating film, achieving maintained voltage charged in the pixel electrode. With such a configuration, the common electrode includes the common electrode-side opened superimposed part configured to be superimposed on the opening superimposed part of the second pixel electrode, an electrostatic capacity is generated between the pixel electrode and the common electrode also in the opening where no light-shielding part is formed. This is more suitable for maintaining the voltage charged in the pixel electrode. Moreover, the common electrode-side opened superimposed part achieves electric field shielding of the pixel electrode at the opening of the light-shielding part, leasing to easy formation of paras parasitic capacitance by the pixel electrode.

(9) The pixel light-shielding portion of the light-shielding part may be partially superimposed on an outer edge of the pixel electrode. With such a configuration, an electrostatic capacity becomes larger between the pixel electrode and the light-shielding part, which is suitable for maintaining the voltage charged in the pixel electrode.

(10) The thin-film transistor substrate may further include a pixel electrode configured to be connected to the drain electrode via contact holes, and disposed on the light-shielding part via the third insulating film on the upper layer side. The contact holes may have openings at a position where the second insulating film, the light-shielding part, and the third insulating film may be superimposed on the drain electrode partially. The openings of the light-shielding parts may be in communication with the contact hole. Such a configuration obtains an enlarged open range of the light-shielding part, leading to easy patterning of the light-shielding part.

The display panel according to the present invention includes the thin-film transistor substrate described above, and an opposite substrate whose plate surface is faced to a plate surface of the thin-film transistor substrate. With the display panel configured in such a manner as above, variation in property of the thin-film transistor is suppressed, achieving satisfied display quality.

The display device according to the present invention includes the display panel described above, and an lighting device faced to the opposite substrate across the thin-film transistor substrate, and configured to apply light to the display panel. With the display device configured in such a manner as above, when the light from the lighting device is applied to the thin-film transistor substrate, the light is applied from the lower layer side with respect to the light-shielding part of the thin-film transistor substrate, but the light is transmitted through the opening of the second light-shielding section. Accordingly, the light is unlikely to be applied to the first light-shielding section from the lower layer side. This causes difficulty in generation of the light reflected from the first light-shielding section to the semiconductor part, leading to suppressed variation in property of the thin-film transistor. Consequently, satisfied display quality is obtainable.

Advantageous Effect of the Invention

According to the present invention, the semiconductor part is less likely to be supplied with light.

BRIEF DESCRIPTION OF THE DRAWINGS

FIG. 12 is a sectional view along a B-B line of FIG. 10.

MODES FOR CARRYING OUT THE INVENTION

First Embodiment

Figure 1:
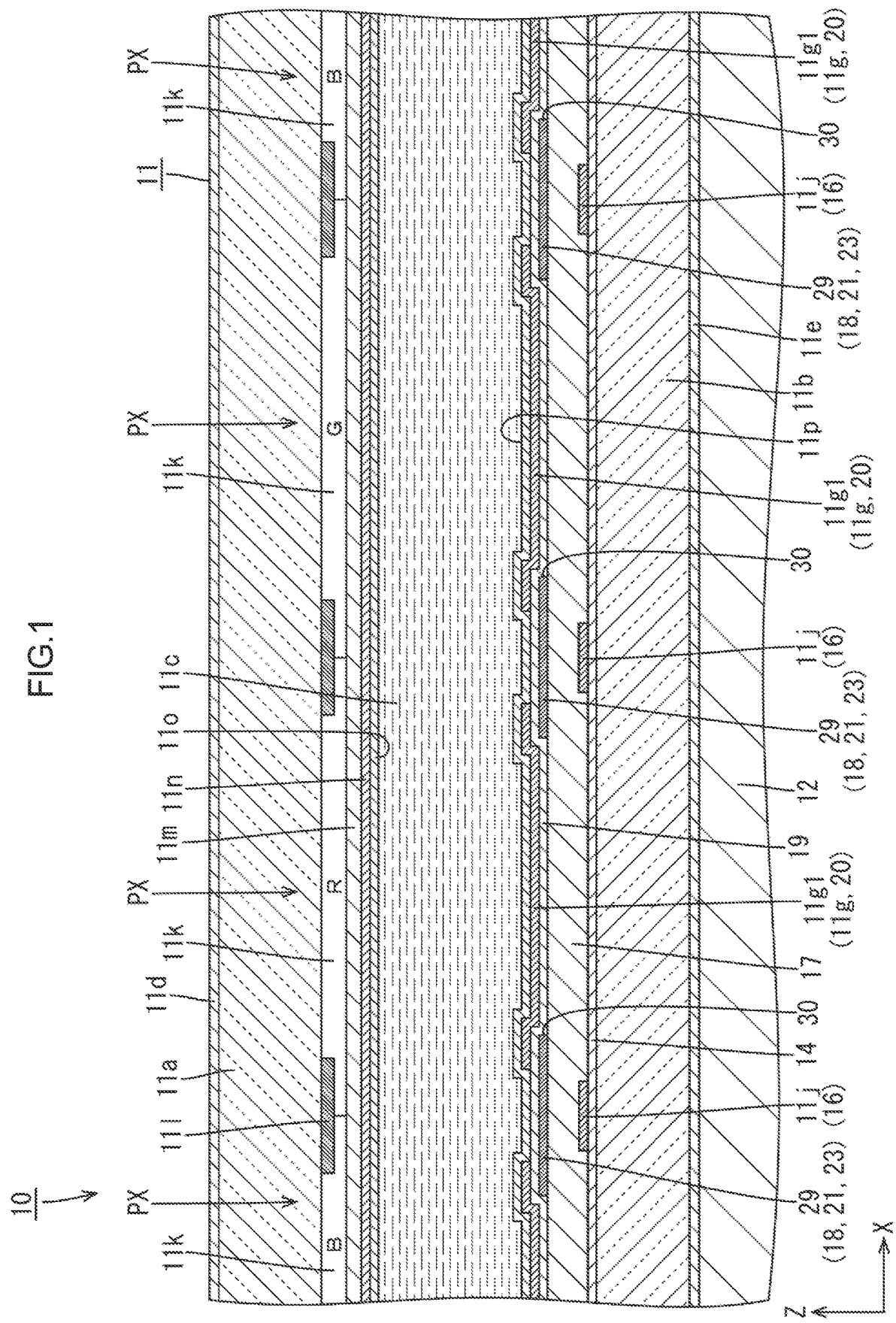
FIG. 1 is a schematic sectional view illustrating a sectional configuration of a liquid crystal panel according to a first embodiment of the present invention.

The following describes a first embodiment of the present invention with FIGS. 1 to 6. The present embodiment exemplarily describes a liquid crystal display device 10 provided with a liquid crystal panel (display panel) 11. Note that each of drawings partially indicates an X-axis, a Y-axis, and a Z-axis, each of which corresponds to the direction where the drawing is illustrated.

As illustrated in FIG. 1, the liquid crystal display device 10 includes at least a liquid crystal panel 11 capable of displaying an image, and a back light device (lighting device) 12 disposed on a backside of the liquid crystal panel 11 and supply light for display to the liquid crystal panel 11. The following describes a configuration of the liquid crystal panel 11 in detail. It should be noted that FIG. 1 schematically illustrates the back light device 12 by chain double-dashed lines.

As illustrated in FIG. 1, the liquid crystal panel 11 includes paired transparent (excellent translucent) substrate 11a, 11b, and a liquid crystal layer 11c disposed between both the substrates 11a, 11b, and contain liquid crystal molecules of a material whose optical property is variable in association with electric field application. The substrates 11a, 11b are sealed each other via a sealant, not shown, with a maintained cell gap by a thickness of the liquid crystal layer 11c. Both the substrates 11a, 11b each include a glass substrate GS that is substantially transparent on which a plurality of films is laminated with a known photo lithography technology. A surface side (opposite to a side adjacent to the back light device 12) of the substrates 11a, 11b is referred to as a CF substrate (opposite substrate) 11a, whereas a rear side (the side adjacent to the back light device 12) thereof is referred to as an array substrate (thin-film transistor substrate, active matrix substrate) 11b. Polarizers 11d, 11e adhere to outer faces of the substrates 11a, 11b, respectively. The liquid crystal panel 11 according to the first embodiment operates in a twisted nematic (TN) mode and in a normally white mode. In the normally white mode, the liquid crystal panel 11 is displayed in white when no voltage is applied to the liquid crystal layer 11c and light has the maximum transmittance. Moreover, the liquid crystal panel 11 is divided into an active area AA at a center portion of a screen where an image is displayed, and a non-active area NAA at an outer periphery of the screen. The non-active area NAA is configured to surround the active area AA in a frame shape and no image is displayed thereon. In addition, both the substrates 11a, 11b have innermost faces contacting the liquid crystal layer On the innermost face, alignment films 11o, 11p are formed, respectively, for orientation of the liquid crystal molecules contained in the liquid crystal layer 11c.

Figure 2:
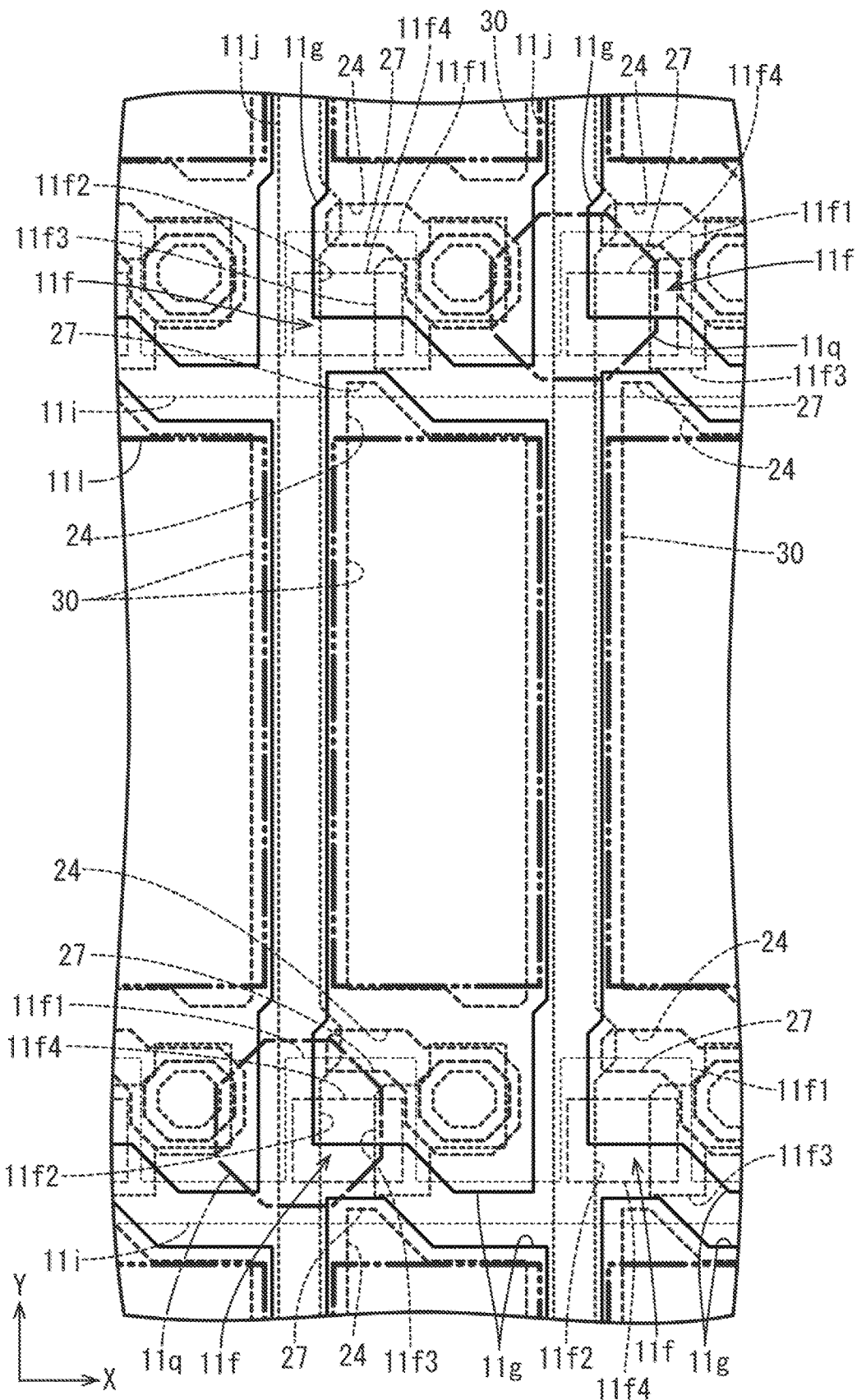
FIG. 2 is a plan view of wiring in a display region of an array substrate that forms the liquid crystal panel.

As illustrated in FIG. 2, multiple TFTs (thin-film transistors, switching elements) 11f and multiple pixel electrodes 11g are arranged in a matrix array (in a row and column manner) on an inner side (adjacent to the liquid crystal layer 11c, adjacent to the opposite face of the CF substrate 11a) of the array substrate 11b in an X-axis direction and a Y-axis direction. In addition, gate lines (scanning lines) 11i and source lines (data lines, signal lines) 11j are arranged so as to surround the TFTs 11f and the pixel electrodes 11g in a grid shape. The gate lines 11i extend in the X-axis direction, whereas the source lines 11j extend in the Y-axis direction. The gate lines 11i and the source lines 11j are connected to gate electrodes 11f1 and source electrodes 11f2 of the TFTs 11f, respectively. The pixel electrodes 11g are connected to drain electrodes 11f3 of the TFTs 11f. Moreover, the TFTs 11f are driven in accordance with various signals supplied to the gate lines 11i and the source lines 11j. Supply of electric potential to the pixel electrodes 11g is controlled in association with the drive. The pixel electrodes 11g are each rectangular in a vertical direction in plan view. The pixel electrodes 11g each have a long side along the Y-axis direction, and a short side along the X-axis direction.

Figure 3:
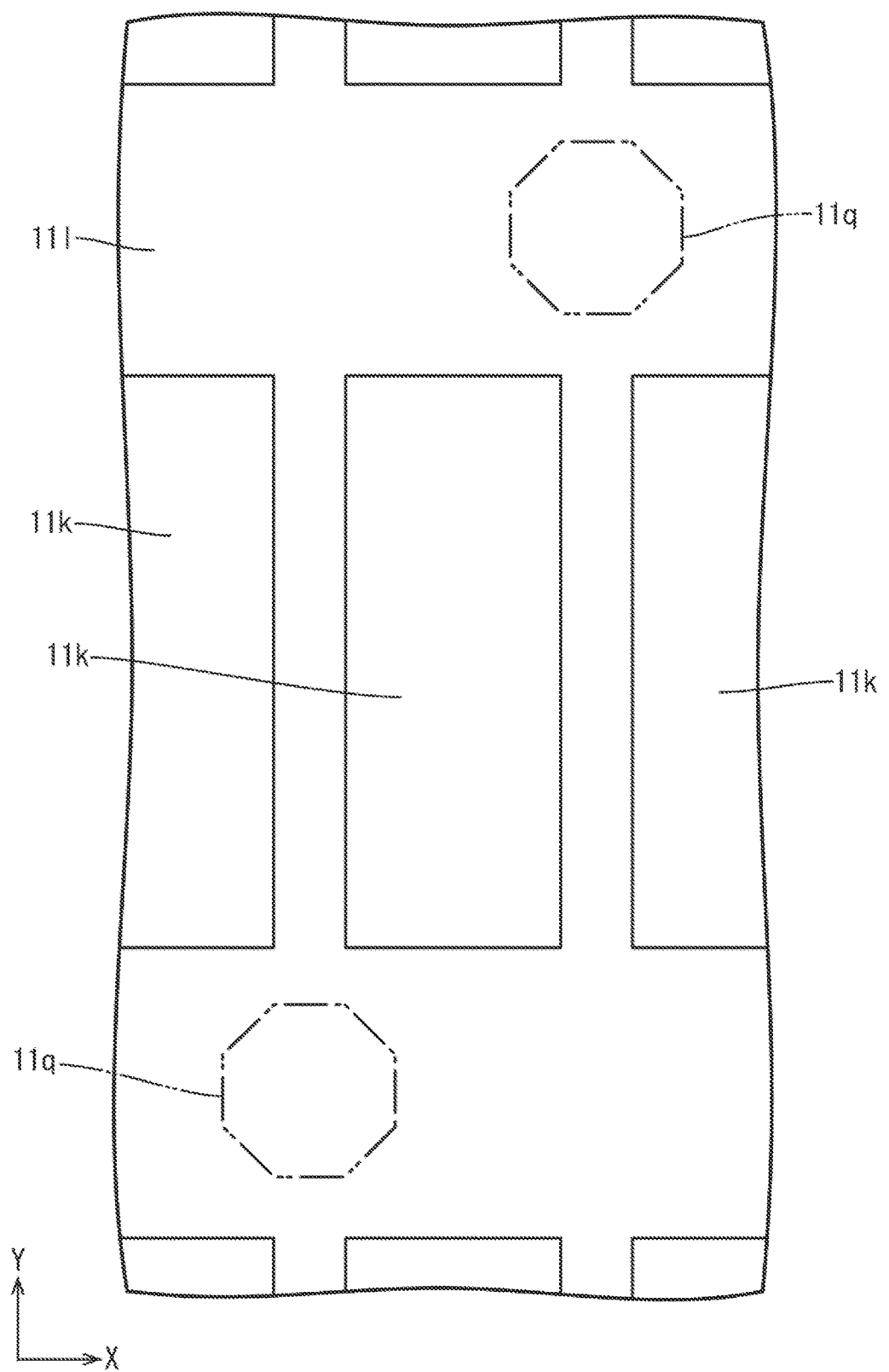
FIG. 3 is a plan view of a display region in a CF substrate that forms the liquid crystal panel.

As illustrated in FIG. 3, the active area AA of the CF substrate 11a includes an inner side where color filters 11k with three colors of red (R), green (G), and blue (B) are provided. Multiple color filters 11k with different colors are arranged along the X-axis direction, and multiple color filters 11k with the same color are arranged along the Y-axis direction, thereby being arranged generally in a matrix array. Each of the color filters 11k are superimposed on each of the pixel electrodes 11g adjacent to the array substrate 11b in plan view. The liquid crystal panel 11 includes the color filters 11k with the colors of R, G, B that are arranged in line in the X-axis direction, and three pixel electrodes 11g opposite to the color filters 11k. The color filters 11k and the pixel electrodes 11g are each paired to form one pixel part PX as a display unit. The pixel part PX is composed of three unit pixels indicating colors of R, G, B individually. An inter-pixel light-shielding part (black matrix) 111 is provided between adjacent color filters 11k. The inter-pixel light-shielding part 111 functions to prevent crossing of light between adjacent pixel parts PX to ensure independency of gradation. In particular, a portion of the inter-pixel light-shielding part 111 extending in the Y-axis direction achieves prevention of color mixture among the pixel parts PX with different colors. The inter-pixel light-shielding part 111 is superimposed on the gate lines 11i and the sourcelines 11j in plan view. The inter-pixel light-shielding part 111 may be made from a metallic material. From the viewpoint of suppression in multiple reflection of external light, it is preferred that the inter-pixel light-shielding part 111 is made from a resin material.

As illustrated in FIG. 1, an overcoat film 11m is provided so as to overlap surfaces of the color filters 11k and the inter-pixel light-shielding parts 111 on an inner sides thereof. The overcoat film 11m is flat almost all over the inner side surface of the CF substrate 11a. A counter electrode 11n is superimposed on an inner surface of the overcoat film 11m. The counter electrode 11n is flat almost all over the inner side surface of the CF substrate 11a. The counter electrode 11n is always constant at a reference electric potential. Consequently, when pixel electrodes 11h connected to the TFTs 11f are charged along with the drive of the TFTs 11f, a potential difference occurs among the pixel electrodes 11h. Then, variation in orientation condition of the liquid crystal molecule contained in the liquid crystal layer 11c occurs due to the potential difference between the counter electrode 11n and the pixel electrodes 11g, and accordingly, variation in polarized light condition of the transmitted light occurs. As a result, a quantity of light transmission of the liquid crystal panel 11 is controlled individually for each of the pixel parts PX and a predetermined colored image is to be displayed. On the surface of the counter electrode 11n, spacers 11q are provided for keeping a gap between the paired substrate 11a, 11b, i.e., a thickness of the liquid crystal layer 11c (cell gap). See chain double-dashed lines in FIGS. 2 to 4.

Figure 5:
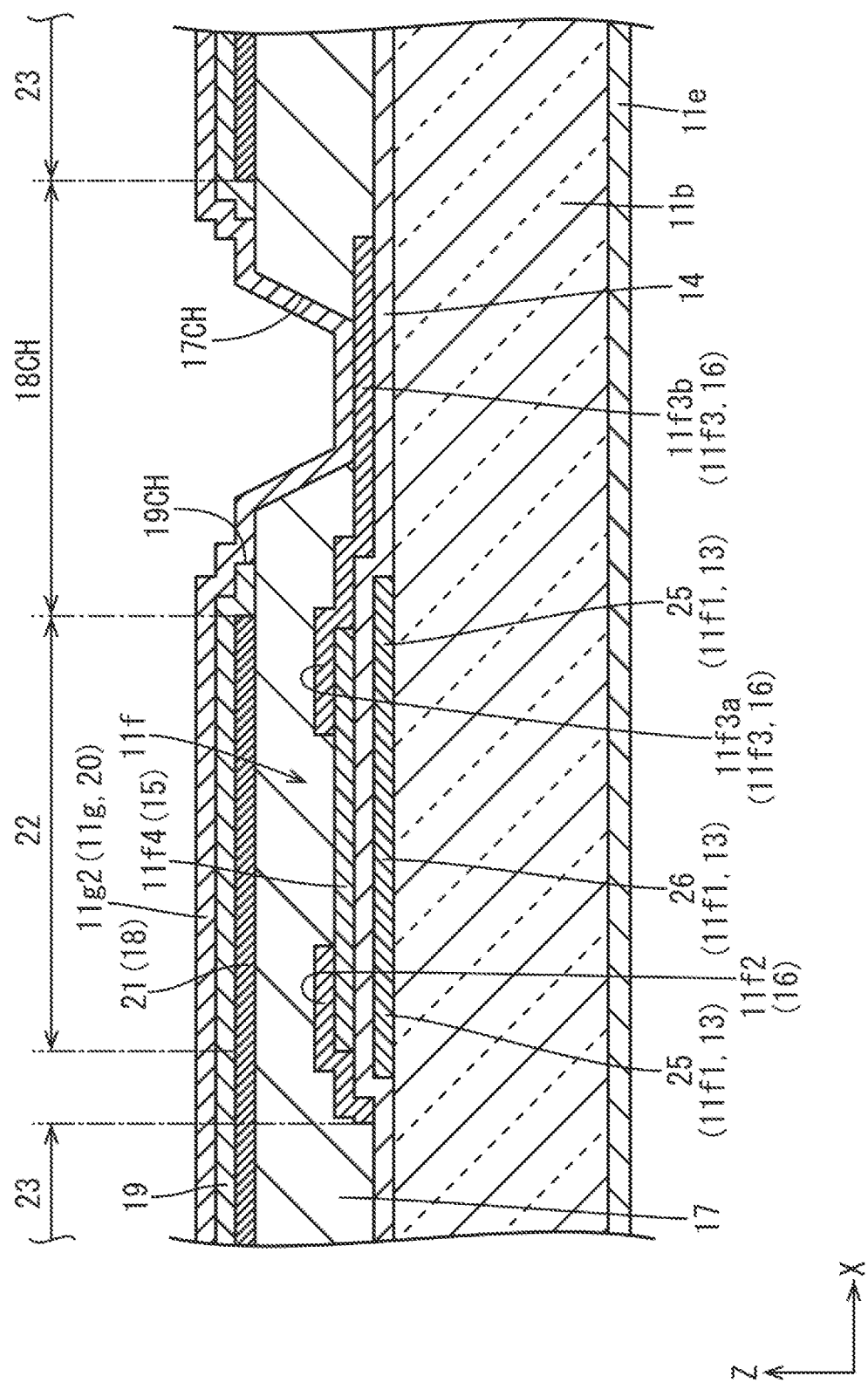
FIG. 5 is a sectional view along an A-A line of FIG. 4.
Figure 6:
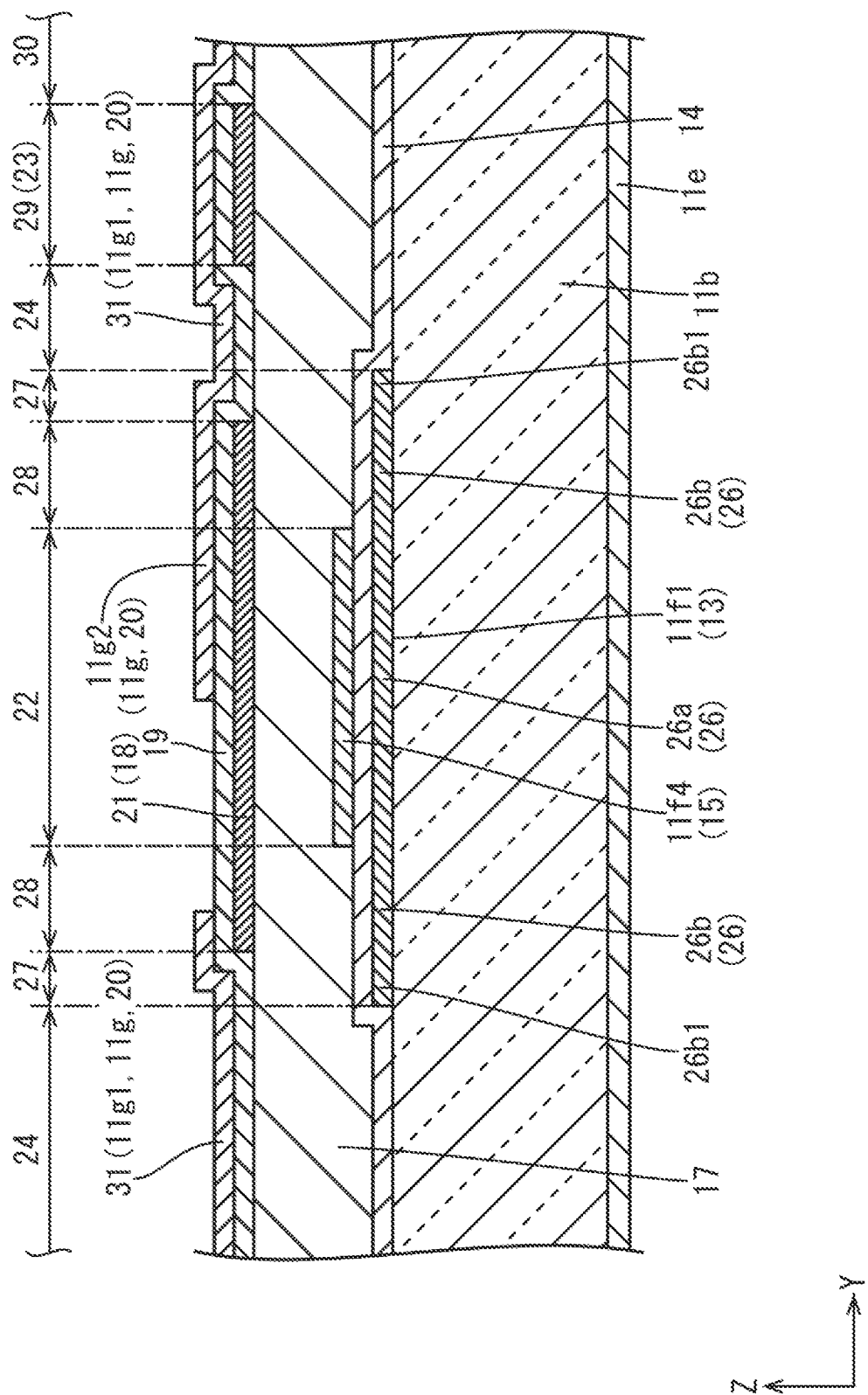
FIG. 6 is a sectional view along a B-B line of FIG. 4.

Various types of films laminated on the internal surface of the array substrate 11b will be described. As illustrated in FIGS. 5 and 6, the array substrate 11b includes, in this order from a lower layer (glass substrate GS) side, a first metal film (first conductive film) 13, a gate insulating film (first insulating film) 14, a semi conductor film 15, a second metal film (second conductive film) 16, a first interlayer insulating film (second insulating film) 17, a third metal film, (third conductive film) 18, a second interlayer insulating film (third insulating film) 19, and a transparent electrode film (fourth conductive film) 20. Note that, in FIGS. 5 and 6, illustration of the alignment film 11p laminated on a further upper layer side from the transparent electrode film 20 is omitted.

The first metal film 13 is a single film made from one-type metallic material or a laminated film made from different types of metal materials or an alloy. Accordingly, the first metal film 13 has conductivity and light-blocking property. Moreover, as illustrated in FIGS. 5 and 6, the first metal film 13 forms the gate lines 11i and the gate electrodes 11f1 of the TFTs 11f. The gate insulating film 14 is made from an inorganic material such as silicon nitride ($SiN_x$) and silicon oxide ($SiO_2$) The gate insulating film 14 keeps insulated between the first metal film 13 on the lower layer side and the semiconductor film 15 and the second metal film 16 on the upper layer side. The semiconductor film 15 is formed by a thin film with a material of such as an oxide semiconductor, amorphous silicon and polycrystalline semiconductor. The semiconductor film 15 forms a channel (semiconductor part) 11f4 configured to be connected to the source electrodes 11f2 and the drain electrodes 11f3 in the TFT 11f. Similar to the first metal film 13, the second metal film 16 is a single film made from a one-type metallic material or a laminated film made from different types of metal materials or an alloy. Accordingly, the second metal film 16 has conductivity and light-blocking property, and forms the source lines 11*j* and the source electrode 11*f*2 and the drain electrodes 11*f*3 of the TFTs 11*f*. The interlayer insulating film 17 has a laminated configuration of an organic material and an inorganic material, and has a film thickness larger than that of a second interlayer insulating film 19 mentioned later. The first interlayer insulating film 17 keeps insulated between the semi conductor film, 15 and the second metal film 16 on the lower layer side and the third metal film 18 on the upper layer side. Similar to the first metal film 13 and the second metal film 16, the third metal film 18 is a single film made from a single-layer film of one type of metal material or a multilayer film made from different types of metal materials (e.g., Cu, Al, Mo, Ti) or an alloy. Accordingly, the third metal film 18 has conductivity and light-blocking property, and forms a light-shielding part 21 mentioned later again. The second interlayer insulating film 19 is made from an inorganic material, and keeps insulated between the third metal film 18 on the lower layer side and the transparent electrode film 20 on the upper layer side. The transparent electrode film 20 is made from a transparent electrode material such as an indium tin oxide (ITO), and forms the pixel electrodes 11*g*.

Figure 4:
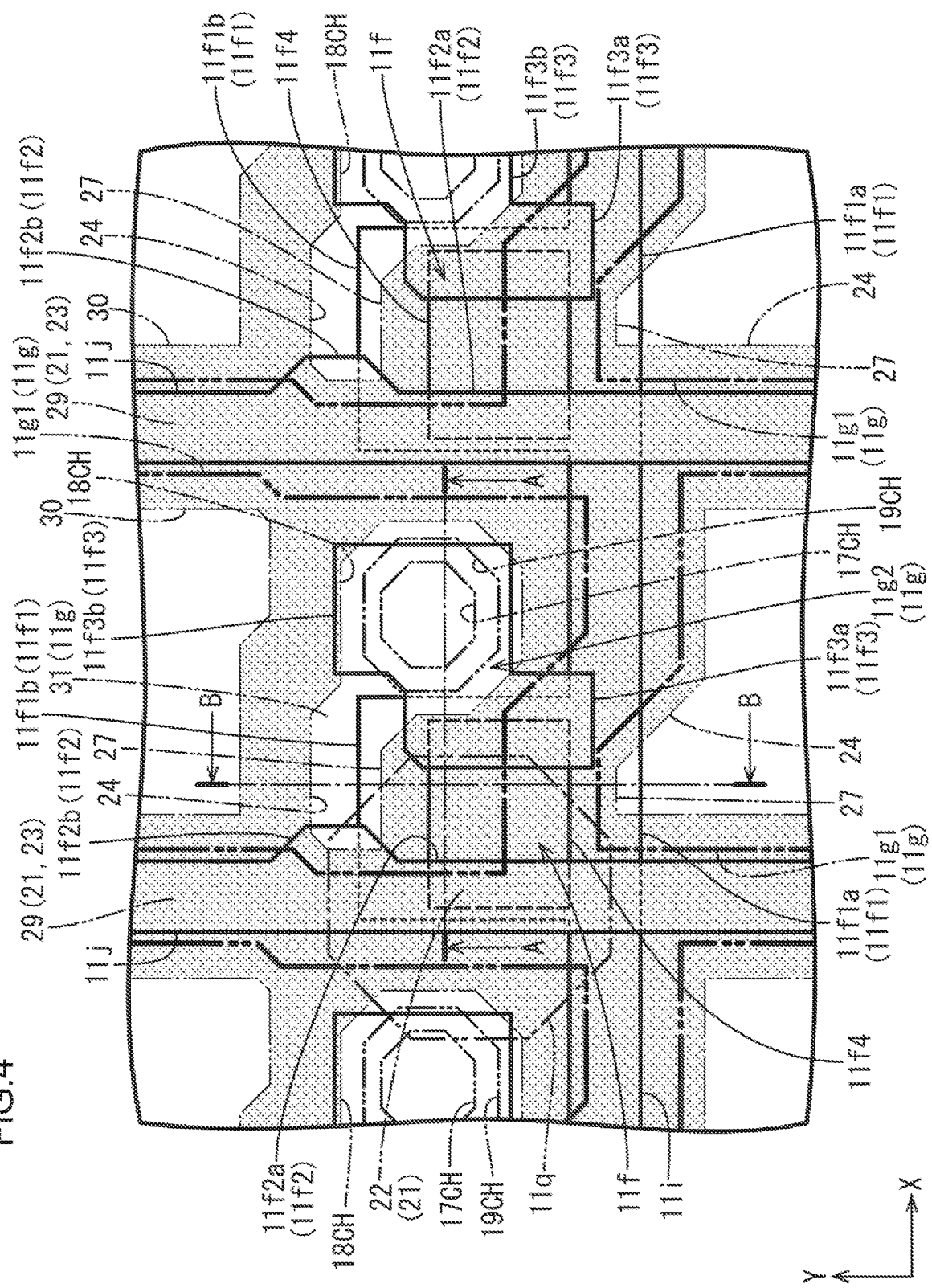
FIG. 4 is an enlarged plan view around a TFT in the display region of the array substrate.

The following describes a configuration of the TFT 11*f* in detail. As illustrated in FIGS. 4 and 5, the TFT 11*f* includes the gate electrode 11*f*1 formed as a part of the gate line 11*i*. The gate electrode 11*f*1 is formed by a gate electrode body 11*f*1*a*, and an extended part 11*f*1*b*. The gate electrode body 11*f*1*a* is composed of a portion of the gate line that intersects the source line a portion adjacent thereto. The extended part 11*f*1*b* is formed by extending the gate electrode body 11*f*1*a* toward the pixel electrode 11*g* (upwardly FIG. 4) as a connection target in the Y-axis direction. The gate electrode 11*f*1 is substantially square in plan view. The gate electrode 11*f*1 has both ends in the X-axis direction that are superimposed on the source electrode 11*f*2 and the drain electrode 11*f*3 in plan view. The gate electrode 11*f*1 drives the TFT 11*f* in accordance with scanning signals supplied to the gate line 11*i* to control current between the source electrode 11*f*2 and the drain electrode 11*f*3, which is to be mentioned later.

As illustrated in FIGS. 4 and 5, the TFT 11*f* includes the source electrode 11*f*2 formed as a part of the source line 11*j* and superimposed on the gate electrode 11*f*1. The source electrode 11*f*2 is formed by a source electrode body 11*f*2*a* as a part of the source line 11*j*. If certain pattern deviation occurs at openings 24 or the pixel electrode 11*g*, an extended part 11*f*2*b* formed by an extended part extending from the source line 11*j* toward the drain electrode 11*f*3 in the X-axis direction (rightward in FIG. 4) ensures suppression with respect to the opening 24 mentioned later in application of the light to the channel 11*f*4, and prevent leak of light. The source electrode body 11*f*2*a* is superimposed on the channel 11*f*4 in plan view to be connected to the channel 11*f*4, which is to be mentioned later. In contrast to this, the extended part. 11*f*2*b* is not superimposed on the channel 11*f*4 in plan view, but is superimposed on the end of the extended part 11*f* that forms the gate electrode 11*f*1.

As illustrated in FIGS. 4 and 5, the TFT 11*f* includes the drain electrode 11*f*3 between the source electrodes 11*f*2 so as to be apart therefrom. The drain electrode 11*f*3 is formed by a first drain electrode component (channel connector) 11*f*3*a* connected to a major of the channel 11*f*4 and superimposed on the channel 11*f*4 in plan view, and a second drain electrode component (pixel electrode connector) 11*f*3*b* not superimposed on the channel 11*f*4 and connected to the pixel electrode 11*g* in plan view. The first drain electrode component 11*f*3*a* has a dimension in the Y-axis direction larger than the channel 11*f*4 and smaller than the gate electrode 11*f*1, and is sandwiched between ends of the gate electrode 11*f*1 in the Y-axis direction. The second drain electrode component 11*f*3*b* is shifted from the first drain electrode component 11*f*3*a* opposite to the gate line 11*i* in the Y-axis direction. At substantially the center port on of the second drain electrode component 11*f*3*b*, contact holes 17CH, 18CH, 19CH are arranged through which a first interlayer insulating film 17, the third metal film 18, and the second interlayer insulating film 19 pass, respectively. In contrast to this, the pixel electrode 11*g* is formed by a first pixel electrode component (pixel electrode body) high not superimposed on the TFT 11*f* in plan view, and a second pixel electrode component 11*g*2 superimposed on at least a part of the TFT 11*f* in plan view. A major of the first pixel electrode component 11*g*1 is disposed at a pixel opening region of the CF substrate 11*a* divided by the inter-pixel light-shielding part 111. Accordingly, the first pixel electrode component 11*g*1 mainly serves display function. A part of the second pixel electrode component 11*g*2 is superimposed on the second drain electrode component 11*f*3*b* in plan view. The superimposed portion is connected to the second drain electrode component 11*f*3*b* via the contact holes 17CH, 18CH, 19CH described above.

As illustrated in FIGS. 4 and 5, the TFT 11*f* includes a channel 11*f*4 composed of the semiconductor film 15. The channel 11*f*4 is superimposed on the gate electrode 11*f*1 via the gate insulating film 13, and is connected to the source electrode 11*f*2 and the drain electrode 11*f*3. The channel 11*f*4 also including a channel connector is horizontally rectangular in plan view. The channel 11*f*4 has both ends in a long side direction (X-axis direction) that are connected to the source electrode 11*f*2 and the drain electrode 11*f*3. The channel 11*f*4 has a short side (width, dimension in the Y-axis direction) smaller than the dimension of the source electrode 11*f*2 and the drain electrode 11*f*3 in the Y-axis direction. The channel 11*f*4 is sandwiched between both ends of the first drain electrode component 11*f*3*a* in the Y-axis direction. If the TFT 11*f* turns to be an ON state in response to a scanning signal supplied to the gate electrode 11*f*1, an image signal (current) supplied to the source line 11*j* is supplied from the source electrode 11*f*2 to the drain electrode 11*f*3 via the channel 11*f*4 made from the semiconductor material. As a result, the pixel electrode 11*g* is charged.

Now, as illustrated in FIGS. 4 to 6, the array substrate 11*b* includes a light-shielding part 21 formed from the third metal film 18. In FIG. 4, a region where the light-shielding part 21 is formed is illustrated with shading. The light-shielding part 21 includes at least a first light-shielding section 22 and a second light-shielding section 23. The first light-shielding section 22 is superimposed on the channel 11*f*4, which forms the TFT 11*f*, in plan view. The second light-shielding section 23 is not superimposed on the gate electrode 11*f*1, the source electrode 11*f*2, and the drain electrode 11*f*3, which form the TFT 11*f*, in plan view. Also, the light-shielding part 21 includes a portion configured not to be superimposed on the channel 11*f*4 in plan view but to be superimposed on the gate electrode 11*f*1, the source electrode 11*f*2, and the drain electrode 11*f*3 in plan view (including an extended light-shielding part 28 which will be mentioned later). The first light-shielding section 22 that forms the light-shielding part 21 can shield the external light (including ambient light external of the liquid crystal display device 10) provided from the upper layer side (opposite to the back light device 12) with respect to the channel 11f4 made from the semiconductor material. This enables suppressed application of the light to the channel 11f4. Here, if external light (including light from the back light device 12) is applied from the lower layer side (adjacent to the back light device 12) with respect to the gate electrode 11f1, the source electrode 11f2, and the drain electrode 11f3, and external light that is incapable of being shielded by the gate electrode 11f1, the source electrode 11f2, and the drain electrode 11f3 is reflected by the first light-shielding section 22, reflected light may be directly applied to the channel 11f4 or the reflected light may be mill timely reflected between the gate electrode 11f1 and the first light-shielding section 22, leading to application of the light to the channel 11f4.

With regard to this, as illustrated in FIGS. 5 and 6, the second light-shielding section 23 that forms the light-shielding part 21 includes the opening 24 adjacent to the TFT 11f. Accordingly, the external light applied from the lower layer side with respect to the gate electrode 11f1, the source electrode 11f2, and the drain electrode 11f3 and is not shielded with the gate electrode 11f1, the source electrode 11f2, and the drain electrode 11f3 is unlikely to pass through the opening 24 of the second light-shielding section 23, leading to more difficulty in contact of the light to the first light-shielding section 22 from the lower layer side. This causes difficulty in generation of the light reflected from the first light-shielding section 22, leading to suppressed application of the light to the channel 11f4. From, the above, a variation in property of the TFT 11f in association with application of the light to the channel 11f4, especially a leak current that may be generated in the TFT 11f in an off state can be decreased. Consequently, satisfied display quality of the liquid crystal panel 11 and the liquid crystal display device 10 is obtainable.

The following describes in detail a positional relationship between the light-shielding part 21 and the TFT 11f. Firstly, as illustrated in FIGS. 4 and 5, the gate electrode 11f1 that forms the TFT 11f includes a first gate electrode component 25 where the source electrode 11f2 and the drain electrode 11f3 are superimposed in plan view, and a second gate electrode component 26 where the source electrode 11f2 and the drain electrode 11f3 are not superimposed in plan view. Among them, the second gate electrode component 26 is formed by a channel superimposed part (semiconductor superimposed part) 26a superimposed on the channel 11f4 in plan view, and channel non-superimposed portions (semiconductor non-superimposed portion) 26b not superimposed on the channel 11f4 in plan view, as illustrated in FIGS. 4 and 6. The channel non-superimposed portions 26b are paired so as to sandwich the channel superimposed part 26a at both ends thereof in the Y-axis direction. The openings 24 of the second light-shielding section 23 are disposed adjacent to the second gate electrode component 26. Specifically, the second light-shielding section 23 includes the paired openings 24 each adjacent to the paired channel non-superimposed portions 26b in the Y-axis direction that for the second gate electrode component 26. With such a configuration, as illustrated in FIG. 5, if the external light applied around the first gate electrode component 25 of the gate electrode 11f1 from the lower layer side is reflected on the first light-shielding section 22, the light reflected is likely to be applied to the source electrode 11f2 and the drain electrode 11f3 on the upper layer side of the channel 11f4, whereas the light reflected is unlikely to be applied to the channel 11f4 directly. In contrast to this, as illustrated in FIG. 6, if the external light applied around the second gate electrode component 26 of the gate electrode 11f1 from the lower layer side is reflected on the first light-shielding section 22, light reflected may possibly contact a region on the upper layer side of the channel 11f4 where neither the source electrode 11f2 nor the drain electrode 11f3 is arranged. In contrast to this, since the openings 24 of the second light-shielding section 23 are disposed adjacent to the second gate electrode component 26, the external light reflected around the second gate electrode component 26 from the lower layer side is likely to pass through the openings 24 of the second light-shielding section 23, and thus is likely to be reflected on the first light-shielding section 22. This enables more suppressed application of the light to the channel 11f4.

As illustrated in FIGS. 4 and 6, the light-shielding part 21 includes an extended opening 27 in at least a part of a region superimposed on the second gate electrode component 26 in plan view, the region being in communication with the openings 24. Specifically, paired extended openings 27 are disposed so as to be superimposed on a part of the paired. channel non-superimposed components 26b (especially, ends opposite to the channel superimposed part 26a) that form the second gate electrode component 26 in plan view, respectively, and to be in communication with the paired openings 24. With such a configuration, the external light applied adjacent to the second gate electrode components 26 from the lower layer side passes through the openings 24 of the second light-shielding section 23 and the extended openings 27 in communication therewith. This causes more difficulty in reflection on of the external light on the first light-shielding section 22. This enables more suppressed application of the light to the channel 11f4.

As illustrated in FIGS. 4 and 6, the light-shielding part 21 includes the extended light-shielding parts 28 that are not superimposed on the channel 11f4 but are superimposed on the gate electrode 11f1 in plan view, and are connected to the first light-shielding section 22. Specifically, the extended light-shielding parts 28 are paired such that the first light-shielding section 22 superimposed on the channel 11f4 in plan view extends toward the both ends thereof in the Y-axis direction. The paired extended light-shielding parts 28 are disposed so as to be superimposed on a part of the paired channel non-superimposed components 26b (especially, a part adjacent to the channel superimposed part 26a) of the gate electrode 11f1 in plan view. With such a configuration, the extended light-shielding part 28 connected to the first light-shielding section 22 allows more suitable shielding of the external light applied to the channel 11f4 from the upper layer side, leading to more suppressed application of light to the channel 11f4.

The following describes in detail a positional relationship between the light-shielding part 21 and the pixel electrode 11g. As illustrated in FIGS. 2 and 4, the light-shielding part 21 includes a pixel light-shielding portion 29 that is opened such that the second light-shielding section 23 surrounds the first pixel electrode component 11g1 that forms the pixel electrode 11g. The pixel light-shielding portion 29 includes a pixel opening 30 at a region of the first pixel electrode component The region is substantially rectangular in a longitudinal direction, and is apart from the TFT 11f in the Y-axis direction. The pixel opening 30 is superimposed on a major of the region. The pixel light-shielding portion 29 shields external light emitted from the lower layer side, whereas the pixel opening 30 transmits the external light toward the first pixel electrode component 11g1 to provide display. Moreover, as illustrated in FIGS. 4 to 6, the pixel electrode 11g is arranged such that the second pixel electrode component 11g2 is partially superimposed on at least a part of the first light-shielding section 22. Moreover, the light-shielding part 21 is configured to be connected to lines where a constant electric potential is applied (e.g., lines to supply signals to the counter electrode 11n) in the non-active area. With such a configuration, since The pixel electrode 11g is partially superimposed on at least a part of the first light-shielding section 22 of the light-shielding part 21 formed by the third metal film 18 as the conductive material, an electrostatic capacity is formed between the pixel electrode 11g and the light-shielding part 21. Accordingly, such a state is suitable for keeping voltage charged in the pixel electrode 11g. This allows prevention of visible defects such as lowered contrast and display unevenness. Moreover, the light-shielding part 21 achieves electric field shielding between gate line 11i connected to the gate electrode 11f1 or the source line 11j connected to the source electrode 11f2 and the pixel electrode 11g. This leads to difficulty in formation of parasitic capacitance between the lines (containing the gate line 11i and the source line 11j) by the pixel electrode, and also prevention of disturbed orientation of the liquid crystal molecules such as reverse tilt. Moreover, as illustrated in FIG. 1, the pixel light-shielding portion 29 is partially superimposed on the outer edge of the first pixel electrode component 11g1 that forms the pixel electrode 11g. With such a configuration, an electrostatic capacity becomes larger between the pixel electrode 11g and the light-shielding part 21, which is suitable for maintaining the voltage charged in the pixel electrode 11g.

As illustrated in FIGS. 4 and 6, the pixel electrode 11g includes an opening superimposed part 31 that is disposed such that the second pixel electrode component 11g2 is superimposed on the opening 24 of the second light-shielding section 23. The opening superimposed part 31 is a part of the pixel electrode 11g. Accordingly, the opening superimposed part 31 transmits light through the opening 24 toward the upper layer side, and thus is unlikely to reflect light toward the lower layer side. With such a configuration, an electric field is obtainable at the opening 24 of the second light-shielding section 23 in accordance with the voltage charged in the pixel electrode 11g including the opening superimposed part 31. This prevents disturbed orientation of the liquid crystal molecule such as the reverse tilt.

As illustrated in FIGS. 4 and 6, the gate electrode 11f1 that forms the TFT 11f includes paired ends 26b1 of the paired channel non-superimposed portion 26b opposite to the channel superimposed part 26a, the paired ends 26b1 not superimposed on the source electrode 11f2 and the drain electrode 11f3. In contrast to this, the light-shielding part 21 includes the paired openings 24 disposed adjacent to the paired ends 26b1 of the second light-shielding sections 23 individually. Moreover, as illustrated in FIG. 4, the light-shielding part 21 includes paired pixel light-shielding portions 29 such that the second light-shielding sections 23 surround the paired pixel electrodes 11g. One of the paired openings 24 is in communication with the contact hole 18CH of the third metal film 18, whereas the other of the paired openings 24 is in communication with the pixel opening 30 of the pixel light-shielding portion 29. The opening 24 in communication with the contact hole 18CH is disposed adjacent to the pixel electrode 11g to be connected to the channel 11f4 in the Y-axis direction. The opening 24 in communication with the pixel opening 30 is disposed adjacent to the pixel electrode 11g not to be connected to the channel 11f4 in the Y-axis direction. As described above, one of the openings 24 is in communication with the contact hole 18CH, and the other of the openings 24 is in communication with the pixel opening 30. This obtains the enlarged open range of the light-shielding part 21, leading to easy patterning of the light-shielding part 21.

Moreover, as illustrated in FIGS. 4 and 6, at least the paired pixel electrodes 11g are arranged so as to be disposed adjacent to the paired openings 24 in the second light-shielding section 23 opposite to the side of the channel 11f4. The paired pixel electrodes 11g each include the opening superimposed part 31 in the second pixel electrode component 11g2 configured to be superimposed on the paired openings 24 of the second light-shielding section 23. With such a configuration, a part of the gate electrode 11f1 adjacent to the paired ends 26b1 corresponds to the openings 24. Accordingly, the external light applied to the gate electrode 11f1 from the lower layer side and is not shielded with the gate electrode 11f1 is unlikely to pass through the paired openings 24 of the second light-shielding section 23, leading to more difficulty in application to the first light-shielding section 22 from the lower layer side. In addition, the opening superimposed part 31 of the second pixel electrode component 11g2 that forms the paired pixel electrodes 11g is superimposed on the paired openings 24 in the second light-shielding section 23. Accordingly, the electric field based on the voltage charged in the paired pixel electrodes 11g achieves prevention of disturbed orientation of the liquid crystal molecules such as reverse tilt. In addition, light passing through the paired openings 24 of the second light-shielding section 23 is available effectively.

As described above, the embodiment of the present invention includes the array substrate thin-film(transistor substrate) 11b including the TFT (thin-film transistor) 11f having at least the gate electrode 11f1, the channel (semiconductor part) 11f4, the source electrode 11f2, and the drain electrode 11f3, and a light-shielding part 21 having at least a first light-shielding section 22 and a second light-shielding section 23. The channel 11f is made from the semiconductor material and is configured to be superimposed on at least a part of the gate electrode 11f1 via the gate insulating film (first insulating film) 14 on an upper layer side. The source electrode 11f2 is disposed on at least a part of the channel 11f4 on the upper layer side and connected to the channel 11f4. The drain electrode 11f3 is disposed on at a part of the channel 11f4 on the upper layer side and connected to the channel 11f4 while being spaced apart from the source electrode 11f2. The light-shielding part 21 is disposed on the channel 11f4, the source electrode 11f2, and the drain electrode 11f3 via the first interlayer insulating film (second insulating film) 17 on the upper layer side. The light-shielding part 21 includes the first light-shielding section 22 configured to be superimposed on the channel 11f4, and the second light-shielding section 23 configured not to be superimposed on the gate electrode 11f1, the source electrode 11f2, and the drain electrode 11f3, and has the openings 24 adjacent to the TFT 11f.

With such a configuration as above, if a signal is applied to the gate electrode 11f1 and the source electrode 11f2 individually that form the TFT 11f, current flows between the source electrode 11f2 and the drain electrode 11f3 via the channel 11f4 made from the semiconductor material. The light-shielding part 21 includes the first light-shielding section. 22 that is disposed on the upper layer side with respect to the channel 11f4 via the first interlayer insulating film 17 and is superimposed on the channel 11f4. The first light-shielding section 22 allows shielding of external light applied from the upper layer side to the channel 11f4 made from the semiconductor material, leading to suppressed application of light to the channel 11f4 . In contrast to this, if external light is applied from the lower layer side with respect to the gate electrode 11/1, the source electrode 11/2, and the drain electrode 11/3, it is assumed that external light that is incapable of being shielded by the gate electrode 11/1, the source electrode 11/2, and the drain electrode 11/3 is reflected by the first light-shielding section 22. Under such an assumption, reflected light may be directly applied to the channel 11/4. Alternatively, the reflected light may be multiply reflected between the gate electrode 11/1 and the first light-shielding section 22, leading to application of the light to the channel 11/4. With regard to this, the light-shielding part 21 includes the second light-shielding section 23 not superimposed on the gate electrode 11/1, the source electrode 11/2, and the drain electrode 11/3, and the second light-shielding section includes the openings adjacent to the TFT 11f. Accordingly, the external light applied from the lower layer side with respect to the gate electrode 11/1, the source electrode 11/2, and the drain electrode 11/3 and not shielded by the gate electrode 11/1, the source electrode 11/2, and the drain electrode 11/3 is likely to pass through the openings 24 of the second light-shielding section 23 easily, and is unlikely to apply the first light-shielding section 22 from the lower layer side. This causes difficulty in generation of the light reflected from the first light-shielding section 22, leading to suppressed application of the light to the channel 11/4. From the above, a variation in property of the TFT 11f in association with application of the light to the channel 11/4, especially a leak current that may be generated in the TFT 11f in an off state can be decreased.

Moreover, the gate electrode 11/1 includes the first gate electrode component 25 where the source electrode 11/2 and the drain electrode 11/3 are superimposed, and the second gate electrode component 26 where the source electrode 11/2 and the drain electrode 11/3 are not superimposed. The second light-shielding section 23 includes the openings 24 arranged adjacent to the second gate electrode component 26. With such a configuration, if the first light-shielding section 22 reflects the external light emitted adjacent to the first gate electrode component 25 of the gate electrode 11/1 from the lower layer side, the light reflected is likely to be applied to the source electrode 11/2 and the drain electrode 11/3 on the upper layer side with respect to the channel 11/4, whereas the light reflected is unlikely to be applied to the channel 11/4 directly. In contrast to this, if external light applied from the lower layer side adjacent to the second gate electrode component 26 of the gate electrode 11/1 is reflected on the first light shielding section 22, light reflected may possibly contact a region of the channel 11/4 on the upper layer side where neither the source electrode 11/2 nor the drain electrode 11/3 is arranged. In contrast to this, since the openings 24 of the second light-shielding section 23 are disposed adjacent to the second gate electrode component 26, the external light reflected around the second gate electrode component 26 from the lower layer side is likely to pass through the openings 24 of the second light-shielding section 23, and thus is likely to be reflected on the first light-shielding section 22. This enables more suppressed application of the light to the channel 11/4.

The light-shielding part 21 includes the extended opening 27 in at least a part of a region superimposed on the second gate electrode component 26, the extended openings being in communication with the openings 24. With such a configuration, the external light applied adjacent to the second gate electrode components 26 from the lower layer side passes through the openings 24 of the second light-shielding section 23 and the extended openings 27 in communication therewith. This causes more difficulty in reflection of the external light on the first light-shielding section 22. This enables more suppressed application of the light to the channel 11/4.

The light-shielding part 21 includes the extended light-shielding part 28 configured not to be superimposed on the channel 11/4 but is superimposed on the gate electrode 11/1, and is connected to the first light-shielding section 22. With such a configuration, the extended light-shielding part 28 connected to the first light-shielding section 22 allows more suitable shielding of the external light applied to the channel 11/4 from the upper layer side, leading to more suppressed application of light to the channel 11/4.

Moreover, the pixel electrode 11g is disposed on the light-shielding part 21 via the third insulating film on the upper layer side and is configured to be connected the drain electrode 11/3. The pixel electrode 11g includes at least the first pixel electrode component 11g1 not superimposed on the TFT 11f, and the second pixel electrode component 11g2 superimposed on at least a part of the TFT 11f. The light-shielding part 21 includes the pixel light-shielding portion 29 with the openings 24 such that the second light-shielding section 23 surrounds the first pixel electrode component 11g1 and is made from the conductive material. The pixel electrode is arranged such that the second pixel electrode component 11g2 is partially superimposed on at least a part of the first light-shielding section 22. With such a configuration as above, the pixel electrode 11g is charged in response to flow of a current between the source electrode 11/2 and the drain electrode 11/3 via the channel 11/4. Since the light-shielding part 21 includes the pixel light-shielding portion 29 with the openings 24 such that the second light-shielding section 23 surrounds the first pixel electrode component 11g1, light passing through the openings 24 is able to be deflected toward the pixel electrode 11g. The pixel electrode 11g disposed on the light-shielding part 21 via the third insulating film, on the upper layer side includes the second pixel electrode component 11g2 a part of which is superimposed on at least a part of the first light-shielding section 22 of the light-shielding part 21 made from the conductive material. This forms electrostatic capacity between the pixel electrode 11g and the first light-shielding section 22. This is suitable for maintaining the voltage charged in the pixel electrode 11g. Moreover, the light-shielding part 21 achieves shielding of the electric field of the pixel electrode 11g to make difficulty in formation of parasitic capacitance by the pixel electrode 11g. In addition, the light-shielding part 21 allows prevention of disturbed orientation of the liquid crystal molecules such as reverse tilt.

Moreover, the pixel electrode 11g includes the opening superimposed part 31 that is disposed such that the second pixel electrode component 11g2 is superimposed on the opening 24 of the second light-shielding section 23. With such a configuration, since the second pixel electrode component 11g2 of the pixel electrode 11g includes the opening superimposed part 31 superimposed on the opening 24 of the second light-shielding section 23, the electric field based on the voltage charged in the pixel electrode 11g containing the opening superimposed part 31 is obtainable to prevent the disturbed orientation such as the reverse tilt of the liquid crystal molecules.

Moreover, the gate electrode 11/1 includes the paired ends 26b1 that form opposite sides. The paired ends 26b1 are not superimposed on the source electrode 11/2 and the drain electrode 11/3, whereas the light-shielding part 21 includes the paired openings 24 in such a manner that the second light-shielding section 23 is arranged adjacent to the paired ends 26*b*1. The pixel electrodes 11*g* are formed at least in pair so as to be arranged opposite to the channel 11*f*4 with respect to the paired openings 24 in the second light-shielding section 23. The pixel electrodes 11*g* formed in pair are arranged such that the opening superimposed part 31 of the second pixel electrode components 11*g*2 are superimposed on the paired openings 24 of the second light-shielding section 23. With such a configuration, a part of the gate electrode 11*f*1 adjacent to the paired ends 26*b*1 corresponds to the openings 24. Accordingly, the external light applied to the gate electrode from 11*f*1 the lower layer side and is not shielded with the gate electrode 11*f*1 is unlikely to pass through the paired openings 24 of the second light-shielding section 23, leading to more difficulty in emission to the first light-shielding section 22 from the lower layer side. In addition, the opening superimposed part 31 of the second pixel electrode component 11*g*2 that forms the paired pixel electrodes 11*g* is superimposed on the paired openings 24 in the second light-shielding section 23. Accordingly, the electric field based on the voltage charged in the paired pixel electrodes 11*g* achieves prevention of disturbed orientation of the liquid crystal molecules such as reverse tilt. In addition, light passing through the paired openings 24 of the second light-shielding section 23 is available effectively.

Moreover, the light-shielding part 21 includes the second light-shielding section 23 having at least the paired pixel light-shielding portions 29, and at least one of the paired openings 24 in the second light-shielding section 23 is in communication with one of the paired pixel openings 30 of the pixel light-shielding portions 29 adjacent thereto. Such a configuration obtains an enlarged open range of the light-shielding part 21, leading to easy patterning of the light-shielding part 21.

Moreover, the pixel light-shielding portion 29 of the light-shielding part 21 is partially superimposed on the outer edge of the pixel electrode 11*g*. With such a configuration, an electrostatic capacity becomes larger between the pixel electrode 11*g* and the light-shielding part 21, which is suitable for maintaining the voltage charged in the pixel electrode 11*g*.

Moreover, the pixel electrode 11*g* configured to be connected to the drain electrode 11*f*3 via the contact holes 17CH to 19CH and is disposed on the light-shielding part 21 via the second interlayer insulating film (third insulating film) 19 on the upper layer side. The contact holes 17CH to 19CH have the openings 24 where the first interlayer insulating film 17, the light-shielding part 21, and the second interlayer insulating film 19 are superimposed on the drain electrode aaf3 partially. The openings 24 of the light-shielding part 21 are in communication with the contact holes 17CH to 19CH. Such a configuration obtains an enlarged open range of the light-shielding part 21, leading to easy patterning of the light-shielding part 21.

Moreover, the liquid crystal panel (display panel) 11 according to the first embodiment of the present invention includes the array substrate 11*b* above, and the CF substrate (opposite substrate) 11*a* whose plate surface is faced to a plate surface of the array substrate 11*b*. With the liquid crystal panel 11 configured in such a manner as above, variation in property of the TFT 11*f* is suppressed, achieving satisfied display quality.

The liquid crystal display device (display device) 10 according to the first embodiment of the present invention the liquid crystal display panel 11 described above, and a back light device (lighting device) 12 configured to be faced to the array substrate 11*b* across the CF substrate 11*a*, and apply light to the liquid crystal panel 11. With the liquid crystal display device 10 configured in such a manner as above, when the light from the back light device 12 is applied to the array substrate 11*b*, the light is applied from the lower layer side with respect to the light-shielding part 21 of the array substrate 11*b*, but the light is transmitted through the openings 24 of the second light-shielding section 23. Accordingly, the light is unlikely to be applied to the first light-shielding section 22 from the lower layer side. This causes difficulty in generation of the light reflected from the first light-shielding section 22, leading to suppressed light irradiation to the charnel 11*f*4. Accordingly, variation in property of the TFT 11*f*1 is suppressed. Consequently, satisfied display quality is obtainable.

Second Embodiment

Figure 7:
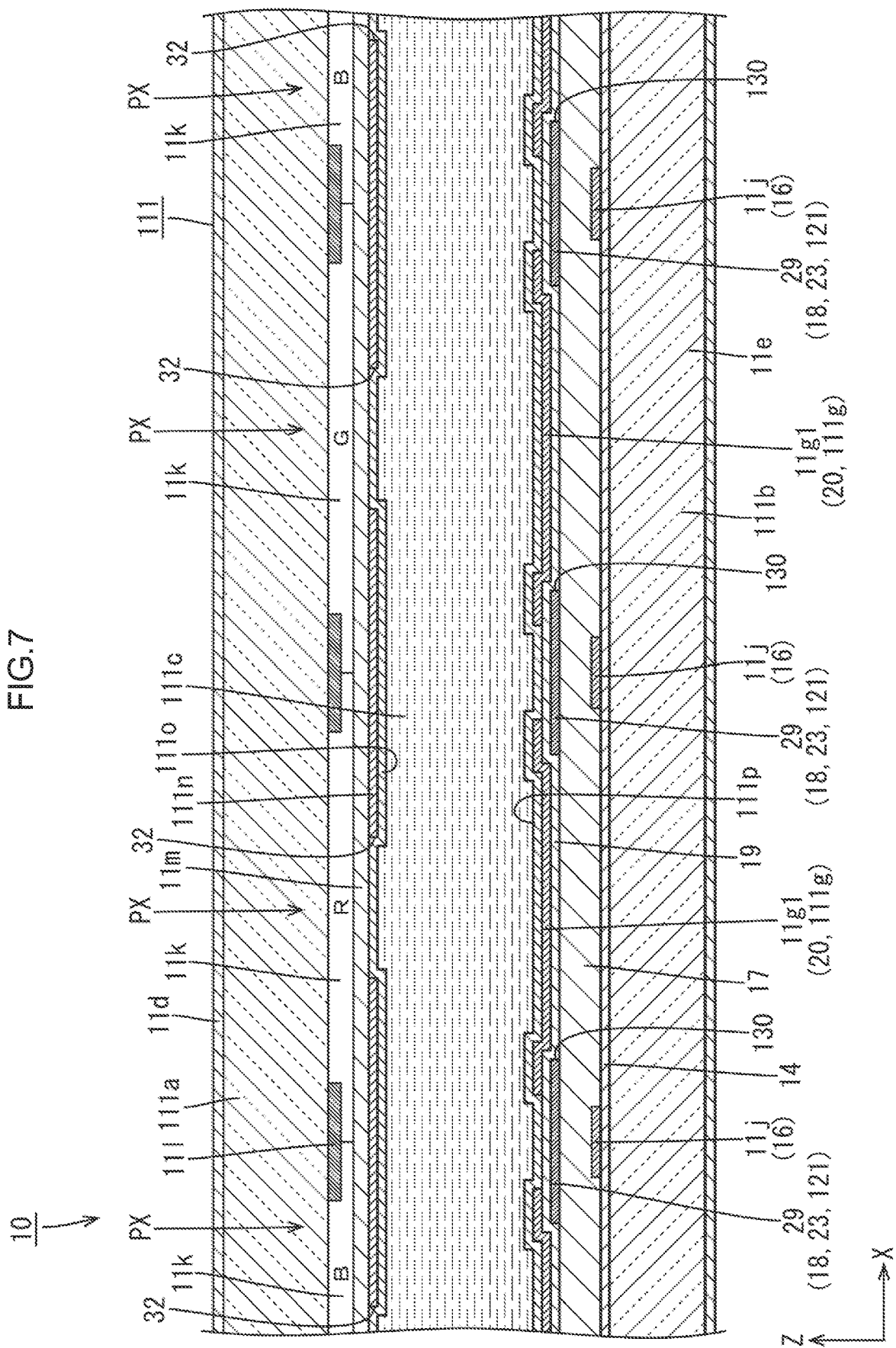
FIG. 7 is a schematic sectional view illustrating a sectional configuration of a liquid crystal panel according to a second embodiment of the present invention.
Figure 8:
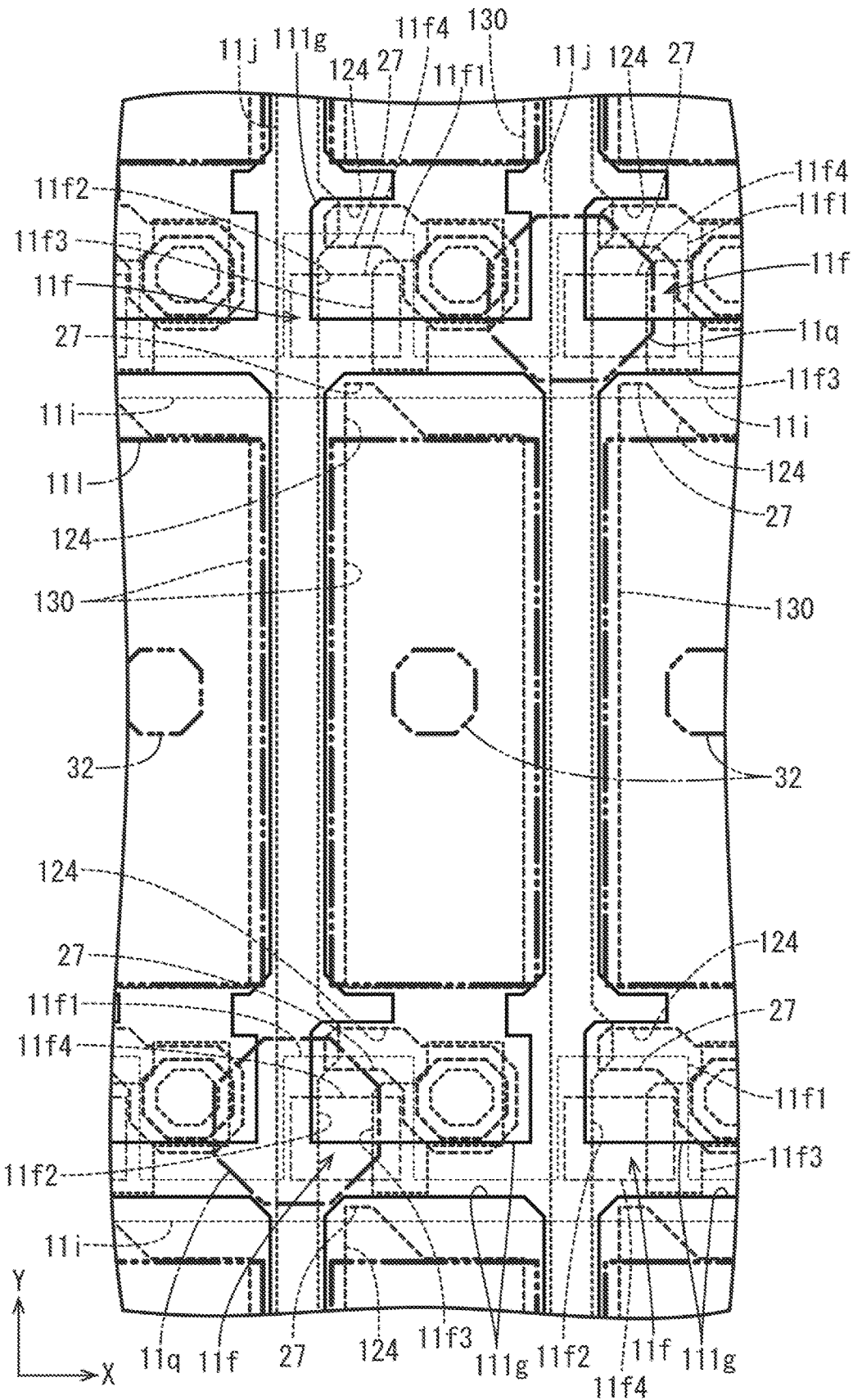
FIG. 8 is a plan view of wiring in a display region of an array substrate that forms the liquid crystal panel.

A second embodiment of the present invention will be described with reference to FIGS. 7 to 9. In the second embodiment, a liquid crystal panel 111 turns a VA mode. Here, the description of the configuration and operational advantage common to that of the first embodiment is to be omitted.

The liquid crystal panel 111 according to this embodiment operates in the vertical alignment (VA) mode, more specifically a continuous pinwheel alignment (CPA) mode. As illustrated in FIGS. 7 and 8, a CF substrate 111*a* and an array substrate 111*b* have innermost faces contacting a liquid crystal layer 111*c*. On the innermost face, alignment films 111*o*, 111*p* are formed, respectively, for orientation of liquid crystal molecules (here, made using a liquid crystal material with negative dielectric anisotropic) contained in the liquid crystal layer 111*c*. These alignment films 111*o*, 111*p* are vertical alignment film that deflects major axes of the liquid crystal molecules to a normal line with respect to the substrate. Moreover, openings 32 are disposed in an opposite electrode 111*n* of the CF substrate 111*a* for controlling orientation of the liquid crystal molecules. An electric field generated between the openings 32 and edges of a pixel electrode 111*g* (electric field deflected toward the normal line of the substrate) can make different orientation directions of the liquid crystal molecules radially and continuously. The openings 32 are disposed substantially the center of a pixel opening 130 that surrounds the pixel electrode 111*g*. FIG. 8 illustrates the openings 32 by chain double-dashed lines. Moreover, the liquid crystal panel 111 is in a normally black mode in which the liquid crystal panel 111 is displayed in black when no voltage is applied to the liquid crystal layer 111*c* and light transmittance becomes minimum.

Figure 9:
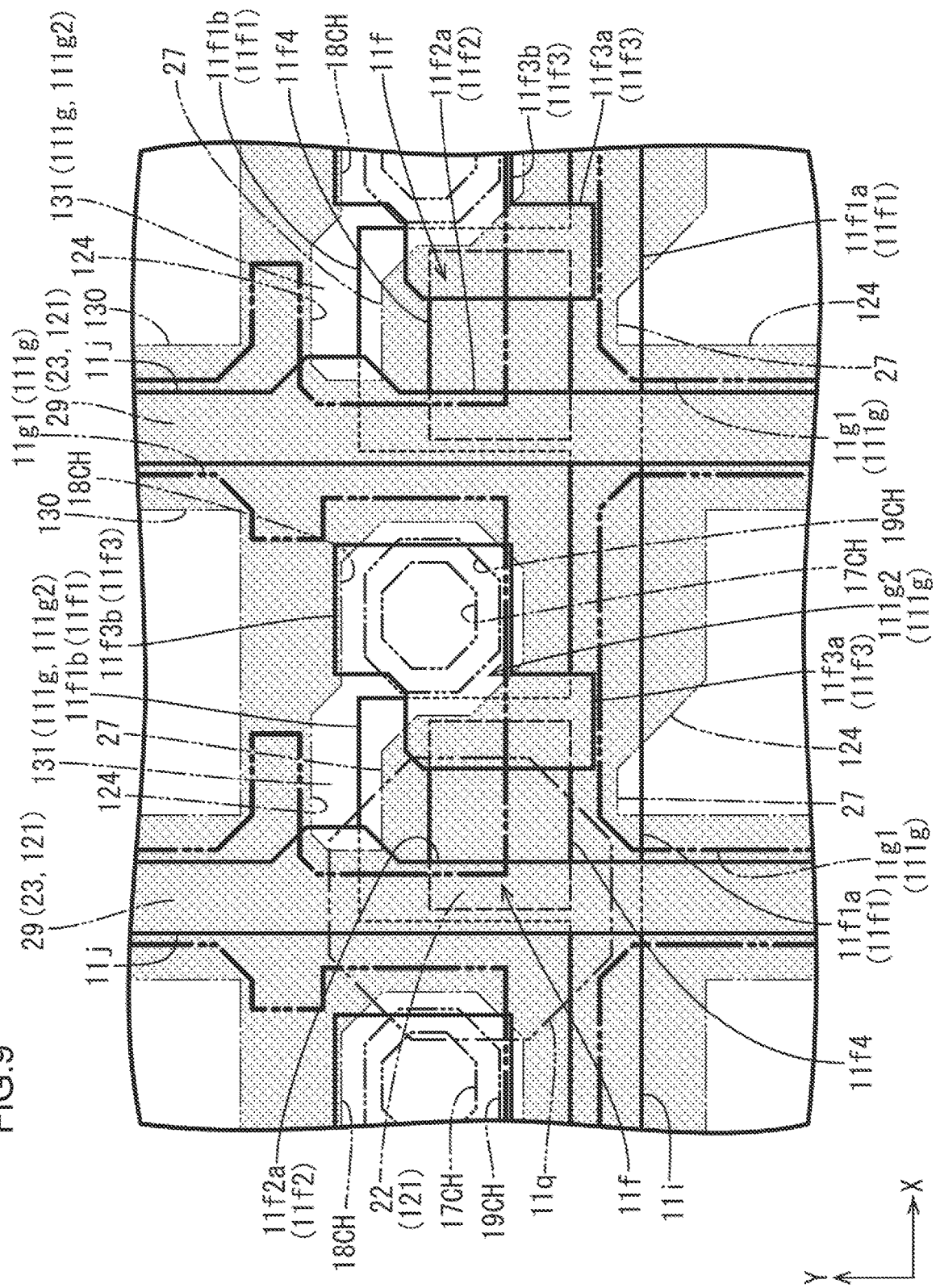
FIG. 9 is an enlarged plan view around a TFT in the display region of the array substrate.

Also in this embodiment, as illustrated in FIG. 9, an opening superimposed part 131 of a second pixel electrode component 111*g*2 in the pixel electrode 111*g* is superimposed on an opening 124 of a light-shielding part 121 in plan view. Accordingly, the electric field based on the voltage charged in the pixel electrode 111*g* prevents disturbed orientation of the liquid crystal molecules in the liquid crystal layer 111*c* present around the opening 124. As a result, this prevents leakage of light and suppresses a lowered response speed. Moreover, the pixel electrode 111*g* of this embodiment differs from that of the first embodiment in its planar shape. For instance, the pixel electrode 111*g* of this embodiment includes corners with oblique cut-off portions. Now, instead of the opening 32, a substantially circular projection made from a resin material may be used for controlling orientation.

Third Embodiment

A third embodiment of the present invention will be described with reference to FIGS. 10 to 12. In the third embodiment, a common electrode 33 is added to the configuration of the first embodiment. Here, the description of the configuration and operational advantage common to that of the first embodiment is to be omitted.

Figure 10:
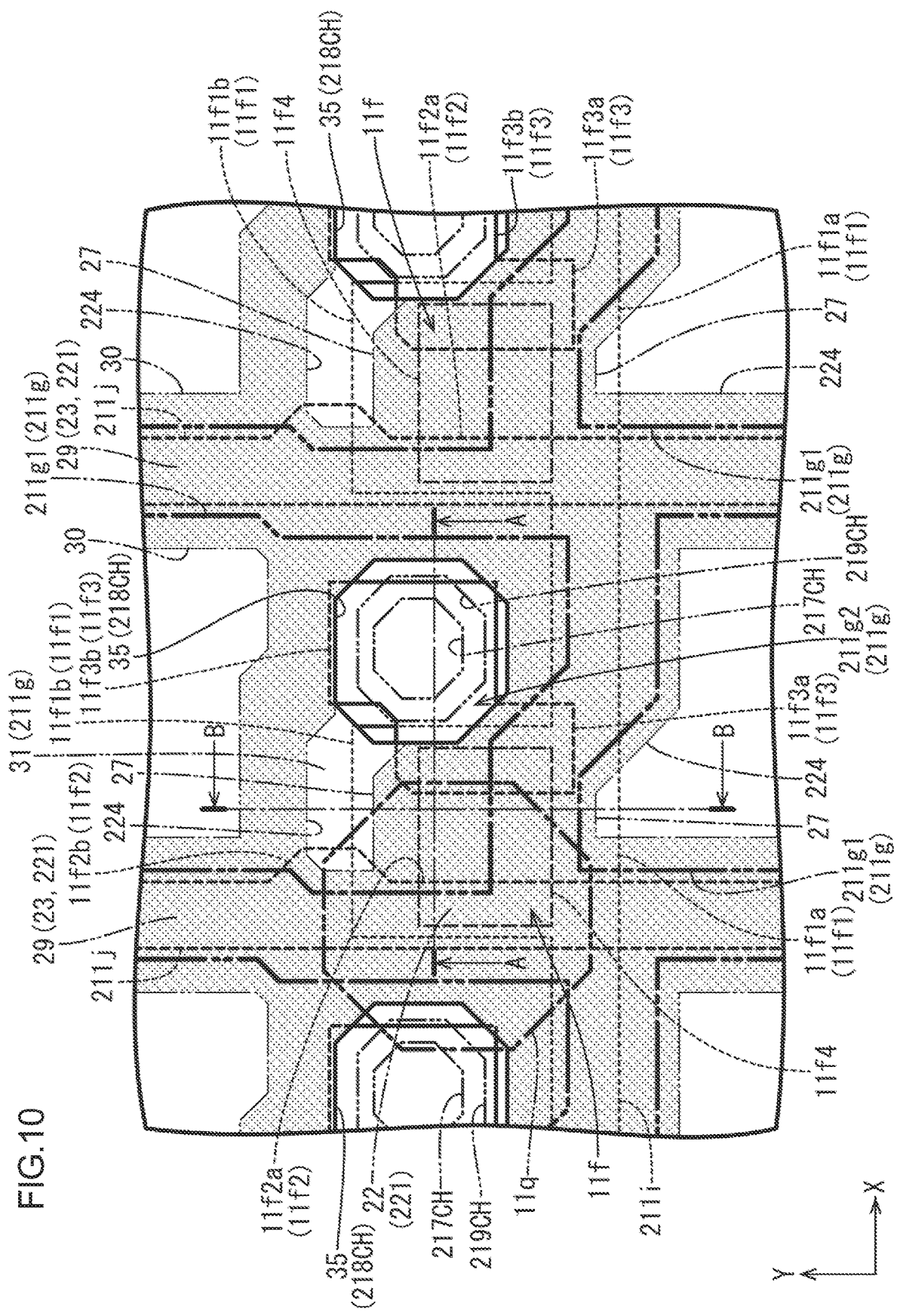
FIG. 10 is an enlarged plan view around a TFT in a display region of an array substrate that forms a liquid crystal panel according to a third embodiment of the present invention.
Figure 11:
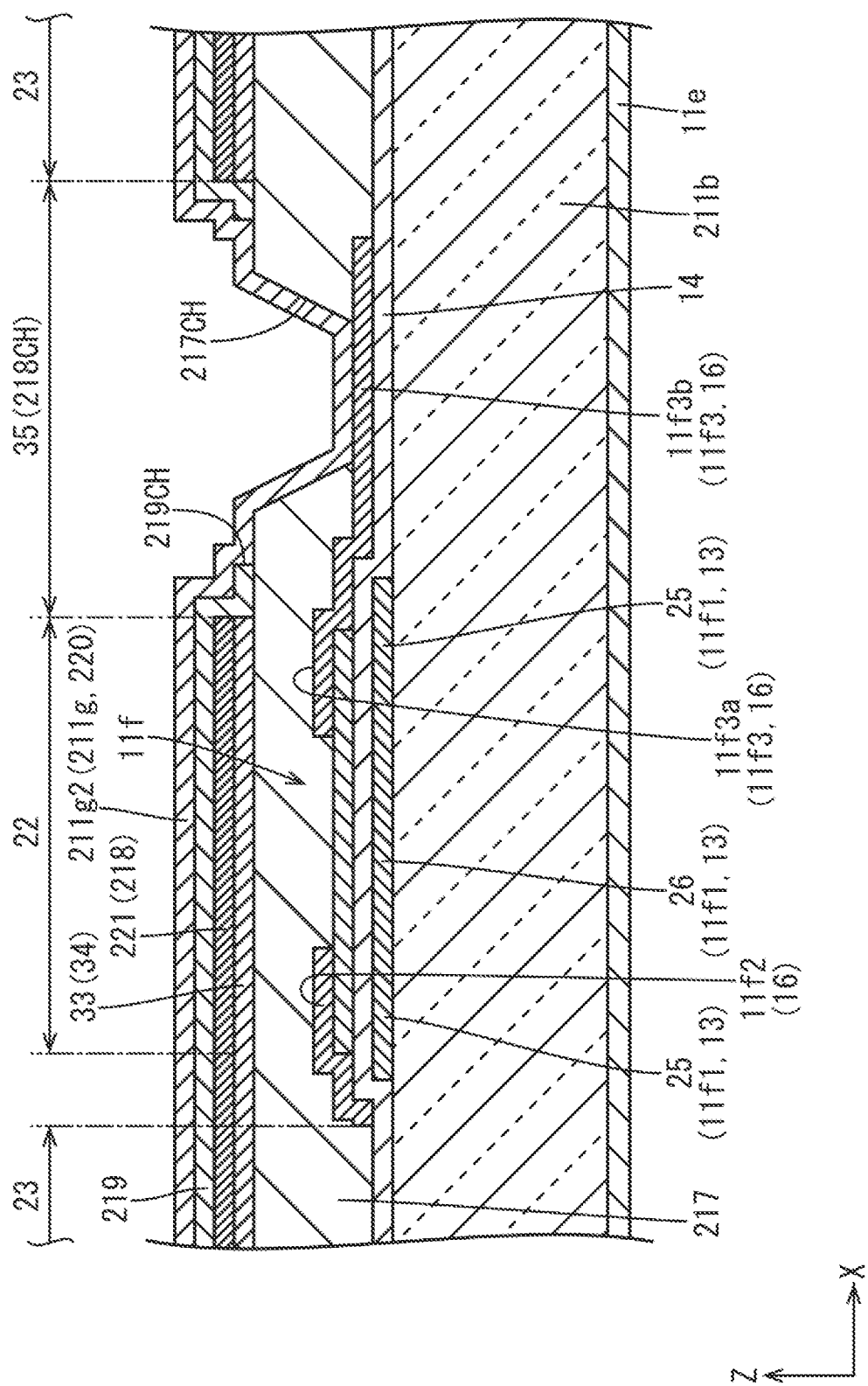
FIG. 11 is a sectional view along an A-A line of FIG. 10.

Now, as illustrated in FIGS. 10 to 11, an array substrate 211b of this embodiment includes the common electrode 33. The common electrode 33 is formed by a second transparent electrode film 34 that is disposed between a first interlayer insulating film 217 and a third metal film 218 that forms a light-shielding part 221. The second transparent electrode film 34 is made from a transparent electrode material similar to a transparent electrode film 220 that forms the pixel electrode 211g. The second transparent electrode film 34 (common electrode 33) is contacted directly to a lower layer of the third metal film 218 (light-shielding part 221) to be connected electrically to the third metal film 218 (light-shielding part 221). The common electrode 33 is arranged in a flat shape within an active area of the array substrate 211b, and includes openings 35 that are superimposed on contact holes 217CH to 219CH in plan view. As described above, an electrostatic capacity is generated between the common electrode 33 and a first pixel electrode component 211g1 of the pixel electrode 211g superimposed on the common electrode 33 via the second interlayer insulating film (third insulating film) 219. This achieves maintained voltage charged in the pixel electrode 211g. In addition, the common electrode 33 is connected to the light-shielding part 221 made from the conductive material. This is more suitable for keeping the maintained voltage in the pixel electrode 211g.

Moreover, as illustrated in FIGS. 10 and 12, the common electrode 33 includes a common electrode-side opened superimposed part 36 configured to be superimposed on an opening 224 of the light-shielding part 221 and an opening superimposed part 231 of the pixel electrode 211g in plan view. With such a configuration, the common electrode-side opened superimposed part 36 is superimposed on the opening superimposed part 231 in plan view, whereby an electrostatic capacity is generated between the pixel electrode 211g and the common electrode 33 at the opening 224 where no light-shielding part 221 is formed. This is more suitable for maintaining the voltage charged in the pixel electrode 211g. Moreover, the common electrode-side opened superimposed part 36 achieves electric field shielding of the pixel electrode 211g in the opening 224 of the light-shielding part 221. This leads to difficulty in formation of parasitic capacitance by the pixel electrode 211g between other lines (containing gate lines 211i and source lines 211j)

According to this embodiment described above, the common electrode 33 is provided between the light-shielding part 221 and the first interlayer insulating film 217, and is superimposed on at least the first pixel electrode component 211g1 of the pixel electrode 211g. The common electrode 33 includes the common electrode-side opened superimposed part 36 configured to be superimposed on the opening superimposed part 231. With such a configuration, the electrostatic capacity is generated between the first pixel electrode component 211g1 and the common electrode 33 of the pixel electrode 211g adjacent to each other via the first interlayer insulating film 217, achieving the maintained voltage charged in the pixel electrode 211g. The common electrode 33 includes the common electrode-side opened superimposed part 36 configured to be superimposed on the opening superimposed part 31 of a second pixel electrode component 211g2 that forms the pixel electrode 211g. Accordingly, the electrostatic capacity is generated between the pixel electrode 211g and the common electrode 33 at the opening 224 where no light-shielding part 221 is formed. This is more suitable for maintaining the voltage charged in the pixel electrode 211g. Moreover, the common electrode-side opened superimposed part 36 achieves electric field shielding; of the pixel electrode 211g at the opening 224 of the light-shielding part 221, leading to easy formation of parasitic capacitance by the pixel electrode 211g.

Other Embodiments

The present invention is not limited to the embodiments described above with the description and the drawings. Such embodiments as under are contained in the technical scope of the present invention.

(1) in each of the embodiments described above, the extended opening is formed so as to be in communication with the opening of the light-shielding part. The detailed formation area and the planar shape of the extended opening are variable appropriately. Alternatively, the extended opening is omittable.

(2) Another arrangement, another planar shape and another formation area of the opening and the extended opening are variable appropriately so as to be different from those in the embodiments described above.

(3) In each of the embodiments described above, the paired openings of the light-shielding part are arranged across the channel in the Y axis direction. Alternatively, one of the paired openings is omittable.

(4) In each of the embodiments described above, the light-shielding part includes the extended light-shielding part. The detailed formation area and the planar shape of the extended light-shielding part are variable appropriately. Alternatively, the extended light-shielding part is omittable.

(5) In each of the embodiments described above, the pixel electrode includes the opening superimposed part. The detailed area of the opening superimposed part configured to be superimposed on the opening is variable appropriately. Alternatively, the opening superimposed part is omittable.

(6) In the third embodiment described above, the common electrode is disposed on the lower layer side with respect to the light-shielding part (between the light-shielding part and the first interlayer insulating film). Alternatively, the common electrode may be disposed on the light-shielding part (between the light-shielding part and the second interlayer insulating film) on the upper layer side.

(7) Except the embodiments described above, the arrangement, the plan shape, and the formation area of the gate electrode, the source electrode, the drain electrode, the channel, and the pixel electrode are appropriately variable. If arrangement of the elements as above is varied, the arrangement of the opening of the light-shielding part may be varied accordingly.

(8) In the embodiments described above, the column spacers are disposed on the surface of the counter electrode in the CF substrate. Alternatively, spherical spacers may be dispersed within the liquid crystal layer to keep a gap between the paired substrates. Also, in this case, a portion of the inter-pixel light-shielding part in the CF substrate that extends in the X-axis direction is selectively omittable. In this case, a portion of the inter-pixel light-shielding part that extends in the Y-axis direction preferable remains for prevention of mixed colors among the pixels.

(9) In the embodiments described above, the first interlayer insulating film is made as a laminated structure with the organic material and the inorganic material. Alternatively, the first interlayer insulating film may be made from either the organic material or the inorganic material only.

(10) In the embodiments described above, the light-shielding part is formed by the third metal film. Alternatively, the light-shielding part may be made from a light-shielding material except the metallic material.

(11) In the embodiments described above, the liquid crystal panel is operated in the TN mode or the VA mode. Alternatively, the liquid crystal panel may be operated in another mode such as a fringe field switching (FFS) mode. In the FFS mode, the counter electrode adjacent to the CF substrate is removed, and a common electrode for forming an electric field is disposed adjacent to the array substrate across the pixel electrode.

EXPLANATION OF SYMBOLS

10: liquid crystal display device (display device)
11, 111: liquid crystal panel (display panel)
11a, 111a: CF substrate (opposite substrate)
11b, 111b, 211b: array substrate (thin-film transistor substrate)
11f: TFT (thin-film transistor)
11f1: gate electrode
11f1: gate electrode
11f2: source electrode
11f3: drain electrode
11f4: channel (semiconductor part)
11g, 111g, 311g: pixel electrode
12: back light device (lighting device)
14: gate insulating film (first insulating film)
17, 217: first interlayer insulating film (second insulating film)
17CH, 217CH: contact hole
18CH, 218CH: contact hole
19, 219: second interlayer insulating film (third insulating film)
19CH, 219CH: contact hole
21, 121, 221: light-shielding part
22: first light-shielding section
23: second light-shielding section
24, 124, 224: opening
25: first gate electrode component
26: second gate electrode component
26b1: end
27: extended opening
28: extended light-shielding part
29: pixel light-shielding portion
31, 131, 231: opening superimposed part
33: common electrode
36: common electrode-side opened superimposed part

The invention claimed is:

1. A thin-film transistor substrate, comprising:
   a thin-film transistor at least including
      a gate electrode,
      a semiconductor part being made from a semiconductor material and being configured to be superimposed on at least a part of the gate electrode via a first insulating film on an upper layer side,
      a source electrode being disposed on at least a part of the semiconductor part on an upper layer side and being configured to be connected to the semiconductor part, and
      a drain electrode being disposed on at least a part of the semiconductor part on an upper layer side and being configured to be connected to the semiconductor part while being spaced apart from the source electrode in a first direction; and
   a light-shielding part disposed on an upper layer side with respect to the semiconductor part, the source electrode, and the drain electrode via a second insulating film, the light-shielding part at least including a first light-shielding section and a second light-shielding section, the first light-shielding section being disposed on an upper layer side with respect to the semiconductor part, the source electrode, and the drain electrode via the second insulating film, and being configured to be superimposed on the semiconductor part, the second light-shielding section being configured not to be superimposed on the gate electrode, the source electrode, and the drain electrode, and having an opening adjacent to the thin-film transistor, the opening extending in a second direction perpendicular to the first direction from an edge of the second light-shielding section to an edge of the gate electrode in a plan view, and the semiconductor part being disposed outside of the opening in the plan view.

2. The thin-film transistor substrate according to claim 1, wherein
   the gate electrode includes a first gate electrode component where the source electrode and the drain electrode are superimposed, and a second gate electrode component where the source electrode and the drain electrode are not superimposed, and
   the second light-shielding part includes the opening arranged adjacent to the second gate electrode component.

3. The thin-film transistor substrate according to claim 2, wherein, the light-shielding part includes an extended opening in at least a part of a region superimposed on the second gate electrode component, the extended opening being in communication with the opening.

4. The thin-film transistor substrate according to claim 1, wherein the light-shielding part includes an extended light-shielding part configured not to be superimposed on the semiconductor part but to be superimposed on the gate electrode and to be connected to the first light-shielding section.

5. The thin-film transistor substrate according to claim 1, further comprising:
   a pixel electrode disposed on the light-shielding part via a third insulating film on an upper layer side and configured to be connected to the drain electrode, wherein
   the pixel electrode at least includes a first pixel electrode component that is not superimposed on the thin-film transistor, and a second pixel electrode component that is superimposed on at least a part of the thin-film transistor, whereas the light-shielding part includes a pixel light-shielding portion that is opened such that the second light-shielding section surrounds the first pixel electrode component and is made from a conductive material, and
   the pixel electrode is arranged such that the second pixel electrode component is partially superimposed on at least a part of the first light-shielding section.

6. The thin-film transistor substrate according to claim 5, wherein the pixel electrode includes an opening superimposed part disposed such that the second pixel electrode component is superimposed on the opening of the second light-shielding section.

7. The thin-film transistor substrate according to claim 6, wherein
the gate electrode includes paired ends that form opposite sides, the paired ends being not superimposed on the source electrode and the drain electrode, whereas the light-shielding part includes paired openings in such a manner that the second light-shielding section is arranged adjacent to the paired ends, and the pixel electrodes are disposed at least in pair so as to be arranged opposite to the semiconductor part with respect to the paired openings in the second light-shielding section, and
the pixel electrodes in the pair are arranged such that the opening superimposed part of the second pixel electrode components is superimposed on the paired openings of the second light-shielding section.

8. The thin-film transistor substrate according to claim 7, wherein
the light-shielding part includes the second light-shielding section having at least the pixel light-shielding portions in pair, and at least one of the paired openings in the second light-shielding section is in communication with one of the paired openings of the pixel light-shielding portions adjacent thereto.

9. The thin-film transistor substrate according to claim 6, further comprising:
a common electrode disposed between the light-shielding part and the third insulating film or between the light-shielding part and the second insulating film, and configured to be superimposed on at least the first pixel electrode component of the pixel electrode, wherein the common electrode includes a common electrode-side configured to be superimposed on the opening superimposed part.

10. The thin-film transistor substrate according to claim 5, wherein the pixel light-shielding portion of the light-shielding part is partially superimposed on an outer edge of the pixel electrode.

11. The thin-film transistor substrate according to claim 1, further comprising:
a pixel electrode configured to be connected to the drain electrode via contact holes, and disposed on the light-shielding part via the third insulating film on the upper layer side, the contact holes having openings at a position where the second insulating film, the light-shielding part, and the third insulating film are superimposed on the drain electrode partially, wherein the openings of the light-shielding parts are in communication with the contact holes.

12. A display panel, comprising:
the thin-film transistor substrate according to claim 1; and
an opposite substrate whose plate surface is faced to a plate surface of the thin-film transistor substrate.

13. A display device, comprising:
the display panel according to claim 12; and
a lighting device faced to the opposite substrate having the thin-film transistor substrate therebetween, and configured to apply light to the display panel.

* * * * *